United States Patent
Miyashita et al.

(10) Patent No.: US 7,945,429 B2
(45) Date of Patent: May 17, 2011

(54) TIRE MODEL DETERMINING METHOD, TIRE TRANSIENT RESPONSE DATA CALCULATING METHOD, TIRE EVALUATING METHOD, AND TIRE DESIGNING METHOD

(75) Inventors: Naoshi Miyashita, Hiratsuka (JP); Kazuyuki Kabe, Hiratsuka (JP)

(73) Assignee: The Yokohama Rubber Co., Ltd., Tokyo (JP)

( * ) Notice: Subject to any disclaimer, the term of this patent is extended or adjusted under 35 U.S.C. 154(b) by 534 days.

(21) Appl. No.: 12/056,148

(22) Filed: Mar. 26, 2008

(65) Prior Publication Data
US 2008/0243446 A1 Oct. 2, 2008

(30) Foreign Application Priority Data

Mar. 28, 2007 (JP) .................. 2007-084085
Mar. 28, 2007 (JP) .................. 2007-084974

(51) Int. Cl.
*G06F 17/50* (2006.01)
*G06F 7/60* (2006.01)
*G06F 17/10* (2006.01)
(52) U.S. Cl. .................. 703/1; 703/2; 702/41
(58) Field of Classification Search .......... 703/1, 2; 702/41

See application file for complete search history.

(56) References Cited

U.S. PATENT DOCUMENTS

| | | | | |
|---|---|---|---|---|
| 5,864,056 | A * | 1/1999 | Bell et al. ............ | 73/146 |
| 6,199,026 | B1 * | 3/2001 | Shiraishi et al. ........ | 702/140 |
| 6,508,102 | B1 * | 1/2003 | Margolis et al. ........ | 73/8 |
| 6,550,320 | B1 * | 4/2003 | Giustino ............ | 73/146 |
| 6,668,637 | B2 * | 12/2003 | Ono et al. .......... | 73/146.5 |
| 7,469,200 | B2 * | 12/2008 | Morman et al. ........ | 703/2 |
| 2003/0164036 | A1 * | 9/2003 | Giustino ............ | 73/146 |
| 2004/0158414 | A1 * | 8/2004 | Bertrand ............ | 702/41 |
| 2005/0005692 | A1 * | 1/2005 | Giustino ............ | 73/146 |
| 2005/0065666 | A1 * | 3/2005 | Miyashita et al. ...... | 701/1 |

FOREIGN PATENT DOCUMENTS

JP 2005-88832 4/2005

* cited by examiner

*Primary Examiner* — Dwin M Craig
(74) *Attorney, Agent, or Firm* — Knobbe Martens Olson & Bear, LLP.

(57) ABSTRACT

A transient response of a tire is simulated by using a effective data of a physical amount. The physical amount is set as a rolling condition of the tire and varies in time. The effective data of the physical amount is calculated by a convolution integral of a response function of an introduced first-order lag response and a time gradient of time-series data of the physical amount. In a tire model determining method, a time constant of a response function of the first-order lag response is determined from measured transient response data. In a tire transient response data calculating method, a transient response data is calculated by using the effective data of the physical amount which is calculated by using a desired physical amount and the first-order lag response.

22 Claims, 16 Drawing Sheets

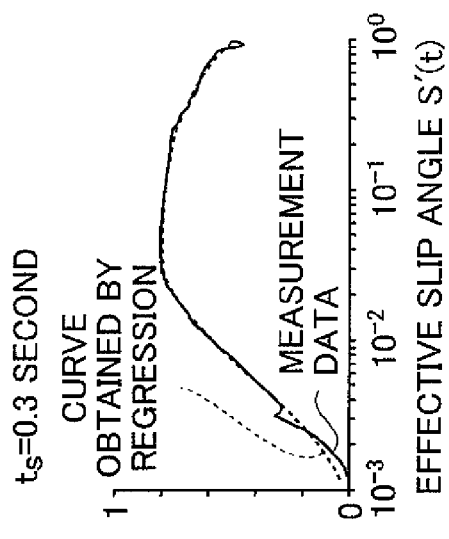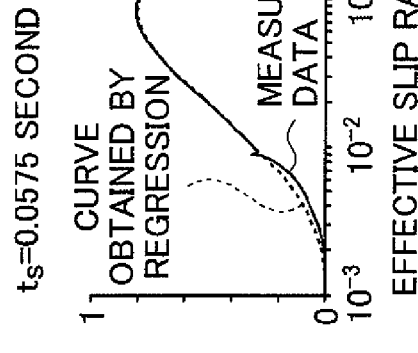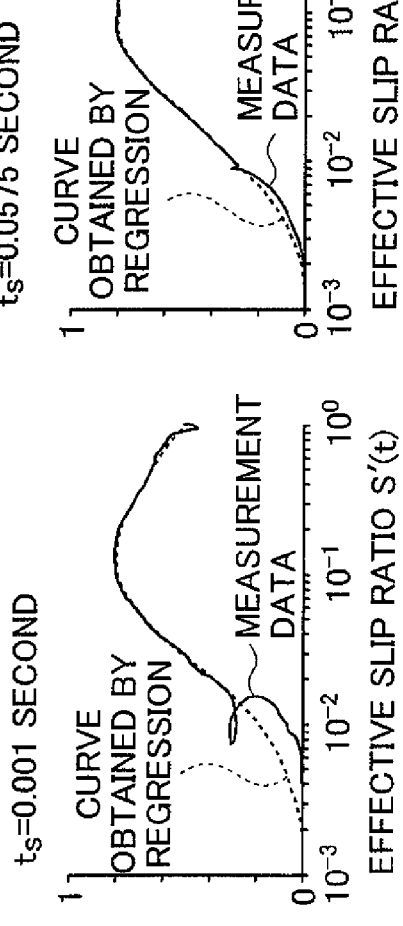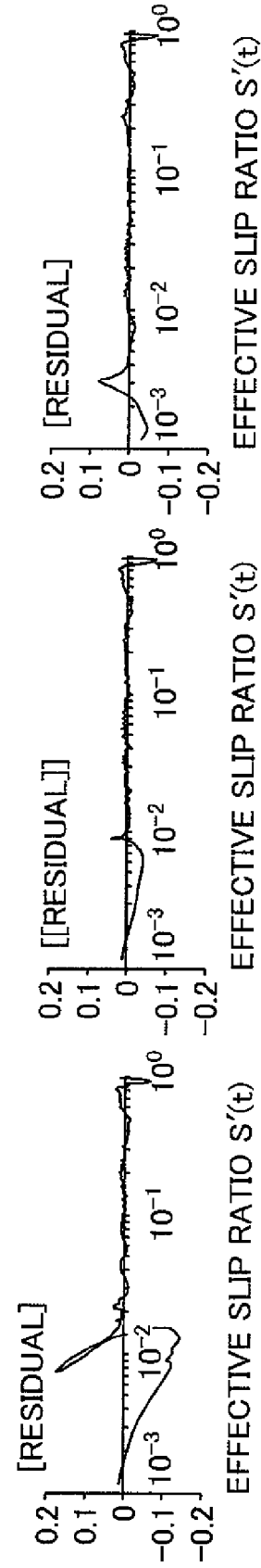
FIG. 5A  FIG. 5B  FIG. 5C

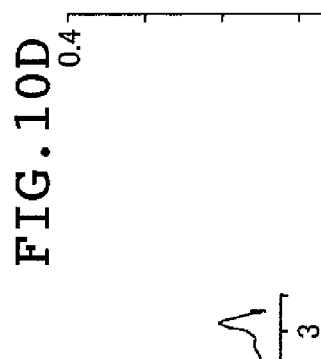
FIG.10A
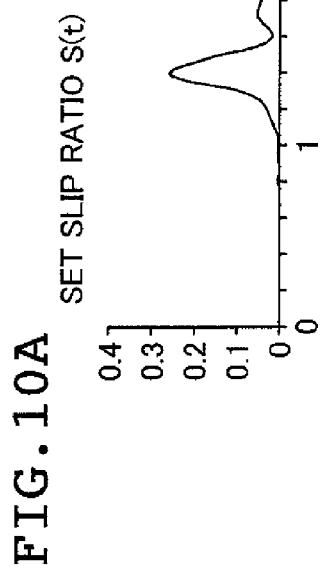
FIG.10B
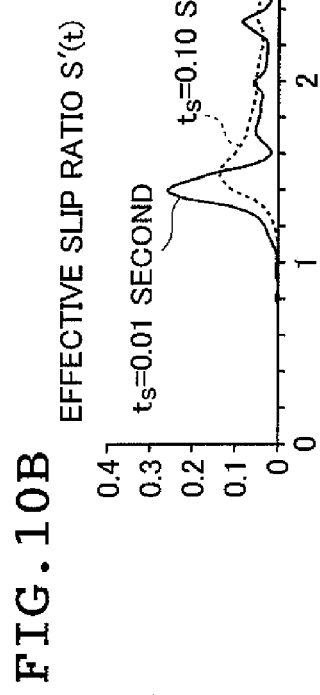
FIG.10C
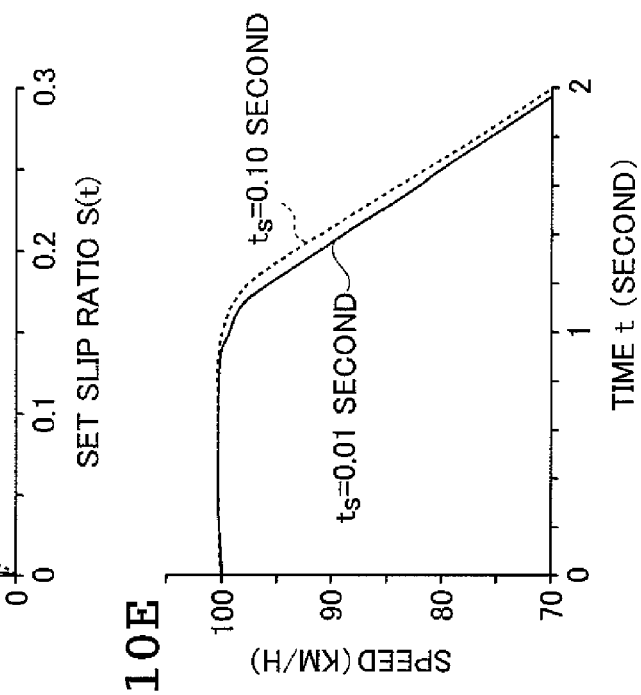
FIG.10D
FIG.10E FIG.17A  SET APPLIED LOAD $F_z(t)$
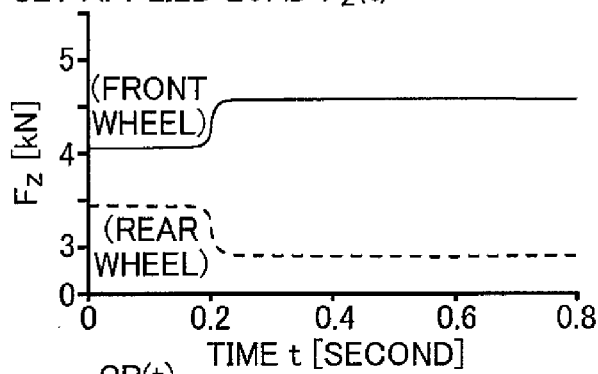
FIG.17B  $CP(t)$
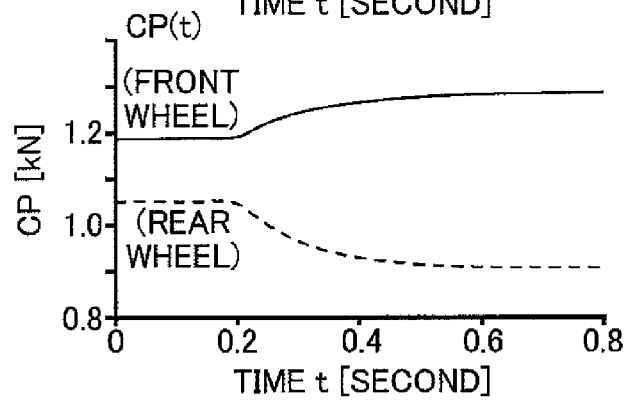
FIG.17C  STABILITY FACTOR $K_s(t)$
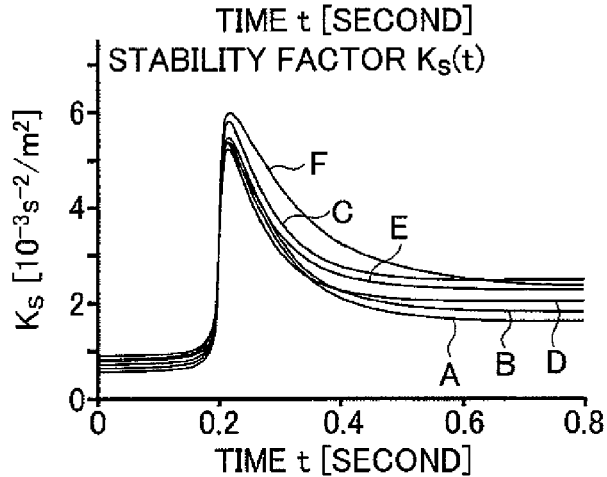
FIG.17D  YAWING NATURAL FREQUENCY $F_n(t)$
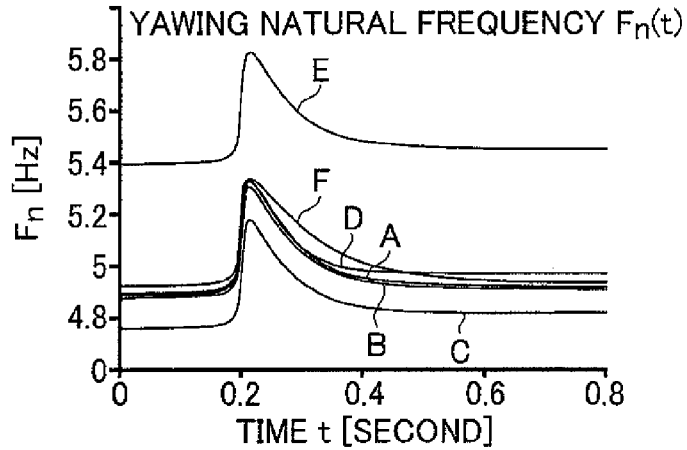

025# TIRE MODEL DETERMINING METHOD, TIRE TRANSIENT RESPONSE DATA CALCULATING METHOD, TIRE EVALUATING METHOD, AND TIRE DESIGNING METHOD

CROSS REFERENCE TO RELATED APPLICATION

This application claims the benefit and priority to Japanese Application Number 2007-084085 and to Japanese Application Number 2007-084974, both of which were filed on Mar. 28, 2007. The disclosures of the above-described applications are hereby incorporated by reference in their entirety.

BACKGROUND OF THE INVENTION

The present invention relates to a tire model determining method for determining a first-order lag model which simulates a transient response of a tire from measurement data of a lateral force or a longitudinal force, or from other measured transient response data of the tire which is obtained by giving a rolling tire a temporally varying physical amount that sets a tire rolling condition, for example, the applied load or the slip ratio in the longitudinal direction of the tire, a tire transient response data calculating method for calculating transient response data of a tire, which is generated by giving the rolling tire desired time-series data of the physical amount that sets a tire rolling condition, and a tire evaluating method and a tire designing method using the former two methods.

A tire is the only member which is interposed between a vehicle and the road surface and transfers a force from the road surface to the vehicle, so tires play an important role in today's automobile industry which seeks advanced vehicle control for safe vehicle driving and avoidance of danger. Analyzing a cornering characteristic of a tire is therefore necessary.

There is known a method disclosed in JP 2005-88832 A, in which a cornering characteristic of a tire in a steady state when a slip angle is given as time-series data is calculated based on a tire dynamic model that is built from multiple tire dynamic element parameters. The publication claims that in this way, a tire can be designed efficiently.

The above tire dynamic model can provide a cornering characteristic in a steady state by supplying a slip angle, but is not capable of simulating a transient response of the longitudinal force which changes with time by supplying a temporally varying value of the slip ratio in the longitudinal direction.

Further, today's vehicles are braked usually with the use of an anti-lock brake system (ABS), which controls the slip ratio on a few Hz basis so that the maximum braking force is always obtained upon braking. The generated braking force is therefore based on a characteristic obtained in a transient state which differs from that in a steady state. This characteristic differs from a characteristic when the braking force is operated in a steady state. Accordingly, there is an inability to evaluate the characteristic of a vehicle that has an ABS from a longitudinal force even if the longitudinal force, in stead of a lateral force, in a steady state can be calculated with the use of the above-mentioned tire dynamic model.

Further, the above tire dynamic model, which can provide a cornering characteristic in a steady state by supplying a constant slip angle, is not capable of simulating a transient response of the lateral force which changes with time by making the applied load fluctuate in a time-series manner while keeping the slip angle constant. A transient response resulting from fluctuations in applied load of the cornering power (CP) which is the lateral force at a slip angle of 1° is a particularly important tire characteristic in evaluating vehicle behavior.

For example, when the applied load fluctuates in a vehicle during cornering, the resultant change in CP changes the steering characteristic and responsiveness of a vehicle. These characteristics of a vehicle therefore cannot be evaluated without taking into account the applied load dependency of the CP of a tire.

SUMMARY OF THE INVENTION

The present invention has been made to solve the above problems of related art, and an object of the present invention is therefore to provide a tire model determining method for determining a tire model that simulates with high precision a transient response of a tire, which is obtained by supplying a temporally varying physical amount that sets a tire rolling condition, for example, the applied load or the slip ratio in the longitudinal direction of the tire, as well as to provide a tire transient response data calculating method for calculating transient response data of a tire, which is generated by giving the tire data of a desired physical amount for transient response, and a tire evaluating method and a tire designing method that use these methods.

The present invention provides a tire model determining method of determining a first-order lag model which simulates a transient response of a tire which is rolling from measured transient response data of the tire, the transient response data generated by giving the tire a temporally varying physical amount that sets a rolling condition of the tire, comprising the steps of:

initially setting a time constant of the first-order lag model to introduce a response function of a first-order lag response in the first-order lag model;

performing a regression calculation which includes:

obtaining, as time-series data of a transient response of the physical amount, effective data of the physical amount by calculating a convolution integral of the introduced response function of the first-order lag response and a time gradient of time-series data of the physical amount which has been given as the rolling condition to the tire;

performing a least square regression on a characteristic curve that represents values of the measured transient response data of the tire with respect to values of the effective data to obtain a single smooth curve by using a curve function for representing a curve; and calculating a sum of square residuals between a least square regression curve obtained in the least square regression and the characteristic curve; and determining the first-order lag model by correcting the set time constant and repeating the regression calculation, until the calculated sum of square residuals is minimized or until the sum of square residuals reaches a given value or lower, and by determining a time constant that minimizes the sum of square residuals or a time constant that makes the sum of square residuals equal to the given value or smaller, as an optimum time constant that defines the first-order lag response.

In the tire model determining method, it is preferable that the first-order lag model which simulates the transient response of the tire is for simulating a transient response of a longitudinal force of the tire from measurement data of the transient response of the longitudinal force of the tire, which is obtained by giving the tire an increase and decrease of a slip ratio in a longitudinal direction of the tire, wherein the physical amount is the slip ratio in the longitudinal direction of the tire, wherein the transient response of the tire is a response of a longitudinal force acting on a rotational axis of the tire, and wherein the tire model determining method further comprises, in determining the first-order lag model, determining a time constant at which the sum of square residuals becomes equal to or lower than the given value as the optimum time constant that defines the first-order lag response.

Then, the slip ratio is given so that a braking force is generated as the longitudinal force of the tire, wherein the time constant of the first-order lag model is defined by a function that changes in accordance with the slip ratio, that sets the time constant to a first value when the slip ratio is 0, that changes the time constant monotonously from the first value to a second value as the slip ratio increases, and that keeps the time constant at the second value from then on, wherein the step of introducing the response function of the first-order lag response includes introducing the response function of the first-order lag response in the first-order lag model by setting the first value and the second value which define the time constant and setting the time constant of the first-order lag model, and wherein the step of determining the first-order lag model includes:

repeating a correction of at least one of the set first value and the set second value which are parameter values and the regression calculation by using the corrected parameter value or values until the sum of square residuals reaches the given value or lower; and determining, as optimum values that define the optimum time constant that determines the first-order lag response, the parameter values of the first value and the second value at which the sum of square residuals is equal to or lower than the given value, to determine the first-order lag model.

In the tire model determining method, it is also preferable that the first-order lag model which simulates the transient response of the tire is for simulating a transient response of a lateral force of the tire from measurement data of the transient response of the lateral force of the tire, which is obtained by giving the tire an increase and decrease of an applied load, wherein the physical amount is the applied load given to the tire, wherein the transient response of the tire is a response of a lateral force acting on a rotational axis of the tire, and wherein the tire model determining method further comprises, in determining the first-order lag model, determining a time constant at which the sum of square residuals is minimum as the optimum time constant that defines the first-order lag response.

Then, the step of introducing the response function of the first-order lag response, in which the time constant of the first-order lag model is in proportion the lateral force, includes introducing the response function of the first-order lag response in the first-order lag model by setting a value of a proportionality constant of the time constant to the lateral force as an initial value, whereby setting the time constant of the first-order lag model, and wherein the step of determining the first-order lag model includes:

repeating a correction of the set value of the proportionality constant and the regression calculation by using the corrected set value until the sum of square residuals reaches a minimum value; and determining a value of the proportionality constant that minimizes the sum of square residuals as the optimum value of the proportionality constant that defines the first-order lag response, to determine the first-order lag model.

The tire model determining method can further comprises obtaining, in obtaining the measurement data of the lateral force, data representing dependency of a contact length of the tire on the applied load in addition to the measurement data of the lateral force, wherein the step of introducing the response function of the first-order lag response, in which the time constant of the first-order lag model is in proportion to a square of the contact length of the tire, includes determining the response function of the first-order lag response in the first-order lag model by setting a value of a proportionality constant of the time constant to the square of the contact length as an initial value and setting the time constant of the first-order lag model, and wherein the step of determining the first-order lag model includes:

repeating a correction of the set value of the proportionality constant and the regression calculation by using the corrected set value until the sum of square residuals reaches a minimum value; and determining a value of the proportionality constant that minimizes the sum of square residuals as an optimum value of the proportionality constant that defines the first-order lag response, to determine the first-order lag model.

The present invention also provides a tire transient response data calculating method of calculating transient response data of a tire which is rolling, transient response data generated by giving the tire desired time-series data of a physical amount that sets a rolling condition of the tire, comprising the steps of:

introducing, by using a tire model determining method, a response function of a first-order lag model which simulates a transient response of the tire, and obtaining a least square regression curve used in determining the first-order lag model; and performing a transient response data calculation which includes:

obtaining, as time-series data of the transient response of the physical amount, first effective data by calculating a convolution integral of the response function of the first-order lag and a time gradient of the desired time-series data; and calculating values of the least square regression curve with respect to the first effective data as values of the transient response data of the tire to changes of the physical amount, wherein the tire model determining method is a method of determining the first-order lag model which simulates a transient response of the tire which is rolling from measured transient response data of the tire, the transient response data generated by giving the tire a temporally varying value of the physical amount that sets a rolling condition of the tire, and wherein the tire model determining method comprises the steps of:

initially setting a time constant of the first-order lag model to introduce the response function of a first-order lag response in the first-order lag model;

performing a regression calculation which includes:

obtaining, as time-series data of the transient response of the physical amount, second effective data of the physical amount by calculating a convolution integral of the introduced response function of the first-order lag and a time gradient of time-series data of the physical amount which has been given as a rolling condition to the tire;

performing a least square regression on a characteristic curve that represents values of the measured transient response data of the tire with respect to values of the second effective data to obtain a single smooth curve by using a curve function for representing a curve; and calculating a sum of square residuals between a least square regression curve obtained in the least square regression and the characteristic curve; and determining the first-order lag model by repeating a correction of the set time constant and the regression calculation by using the corrected set time constant, until the calculated sum of square residuals is minimized or until the sum of square residuals reaches a given value or lower, and by determining a time constant that minimizes the sum of square residuals or a time constant that makes the sum of square residuals equal to the given value or lower, as an optimum time constant that defines the first-order lag response.

In the tire transient response data calculating method, it is preferable that the first-order lag model is for simulating the transient response of a longitudinal force of the tire, wherein the physical amount is a slip ratio in the longitudinal direction of the tire, wherein the measured transient response data of the tire and the transient response data to be calculated of the tire are data of a longitudinal force acting on a rotational axis of the tire, and wherein the tire transient response data calculating method further comprises, in determining the first-order lag response, determining a time constant that makes the sum of square residuals equal to or lower than the given value as the optimum time constant that defines the first-order lag response.

Then, in the tire model determining method, the slip ratio is given so that a braking force is generated as the longitudinal force of the tire, wherein the time constant of the first-order model is defined by a function that changes in accordance with the slip ratio, that sets the time constant to a first value when the slip ratio is 0, that changes the time constant monotonously from the first value to a second value as the slip ratio increases, and that keeps the time constant at the second value from then on, wherein the step of introducing the response function of the first-order lag response of the tire model determining method includes introducing the response function of the first-order lag response in the first-order lag model by setting the first value and the second value which define the time constant, whereby setting the time constant of the first-order lag model, and wherein the step of determining the first-order lag model of the tire model determining method includes:

repeating a correction of at least one of the set first value and the set second value which are parameter values and the regression calculation by using the corrected set value or values until the sum of square residuals reaches the given value or lower; and determining, as optimum values that define the optimum time constant that determines the first-order lag response, the parameter values of the first value and the second value at which the sum of square residuals is equal to or lower than the given value, to determine the first-order lag model.

In the tire transient response data calculating method, it is also preferable that the first-order lag model is for simulating a transient response of a lateral force of the tire, wherein the physical amount is an applied load which is given to the tire, wherein the measured transient response data of the tire and the transient response data to be calculated of the tire are data of a lateral force acting on a rotational axis of the tire, and wherein the tire transient response data calculating method further comprises, in determining the first-order lag response, determining a time constant that minimizes the sum of square residuals as the optimum time constant that defines the first-order lag response.

Then, it is preferable that the step of introducing the response function of the first-order lag response of the tire model determining method, in which the time constant of the first-order lag model is in proportion to the lateral force, includes introducing the response function of the first-order lag response in the first-order lag model by setting a value of a proportionality constant of the time constant to the lateral force as an initial value, whereby setting the time constant of the first-order lag model, and wherein the step of determining the first-order lag model of the tire model determining method includes:

repeating a correction of the set value of the proportionality constant and the regression calculation by using the corrected set value until the sum of square residuals reaches a minimum value; and determining a value of the proportionality constant that minimizes the sum of square residuals as an optimum value of the proportionality constant that defines the first-order lag response, to determine the first-order lag model.

Then, the tire transient response data calculating method can further comprises obtaining, in obtaining the measurement data of the lateral force, data representing dependency of a contact length on the applied load in addition to the measurement data of the lateral force, wherein the step of introducing the response function of the first-order lag response of the tire model determining method, in which the time constant of the first-order lag model is in proportion to a square of the contact length of the tire, includes introducing the response function of the first-order lag response in the first-order lag model by setting a value of a proportionality constant of the time constant to the square of the contact length as an initial value, whereby setting the time constant of the first-order lag model, and wherein the step of determining the first-order lag model of the tire model determining method includes:

repeating a correction of the set value of the proportionality constant and the regression calculation by using the corrected set value until the sum of square residuals reaches a minimum value; and determining a value of the proportionality constant that minimizes the sum of square residuals as an optimum value of the proportionality constant that defines the first-order lag response, to determine the first-order lag model.

In the tire transient response data calculating method, values of the transient response data are preferably calculated sequentially for each time step which is defined by a certain time width, wherein the step of calculating the transient response data includes calculating the second effective data in a time step by determining the time constant by using the value of the transient response data that has been calculated at a time prior to the time step.

The present invention also provides a tire evaluating method and a tire designing method. The tire evaluating method and the tire designing method uses the above tire model determining method and the tire transient response data calculating method.

In the tire model determining method according to the present invention, the effective data is obtained by calculating the convolution integral of the response function of the first-order lag and the time gradient of the time-series data of the physical amount set to the tire, the least square regression is performed on the characteristic curve that represents the values of the measured transient response data of the tire with respect to the values of the effective data to obtain the single smooth curve by using the curve function, and the time constant of the response function is determined so that the sum of square residuals between the least square regression curve obtained in the least square regression and the characteristic curve is minimized, or is equal to or lower than the given value. The first-order lag model can thus be calculated uniquely and accurately from the time-series data of an actually measured axial force. In particular, the actual behavior of a braking/driving characteristic can be simulated by changing the time constant of the response function of the first-order lag model in accordance with the slip ratio. Also, the actual behavior of a cornering characteristic can be simulated by changing the time constant of the response function of the first-order lag model in accordance with the lateral force or the contact length.

The curve obtained by the least square regression in determining the first-order lag model can be used in combination with the first-order lag model to reproduce transient response data of the tire's longitudinal force or lateral force for any desired slip ratio or applied load set by an operator or the like.

Further, the transient response data of the tire's longitudinal force or lateral force can be predicted through calculation with the use of a tire model by giving the tire desired data as a slip ratio, an applied load, or other physical amount that sets a rolling condition for prediction of the tire's transient response. The present invention is therefore effective for evaluation of tire characteristics.

BRIEF DESCRIPTION OF THE DRAWINGS

In the accompanying drawings:

FIGS. 5A to 5C are diagrams showing other examples of various types of data obtained by the tire model determining method that is shown in FIG. 3;

FIGS. 10A to 10E are diagrams showing examples of data obtained by the tire evaluating method according to the present invention;

FIGS. 17A to 17D are diagrams showing other examples of data obtained by the tire evaluating method according to the present invention.

DETAILED DESCRIPTION OF THE PREFERRED EMBODIMENTS

Hereinafter, a detailed description will be given on a tire model determining method, tire transient response data calculating method, tire evaluating method, and tire designing method of the present invention through embodiments illustrated in the accompanying drawings.

Figure 1:
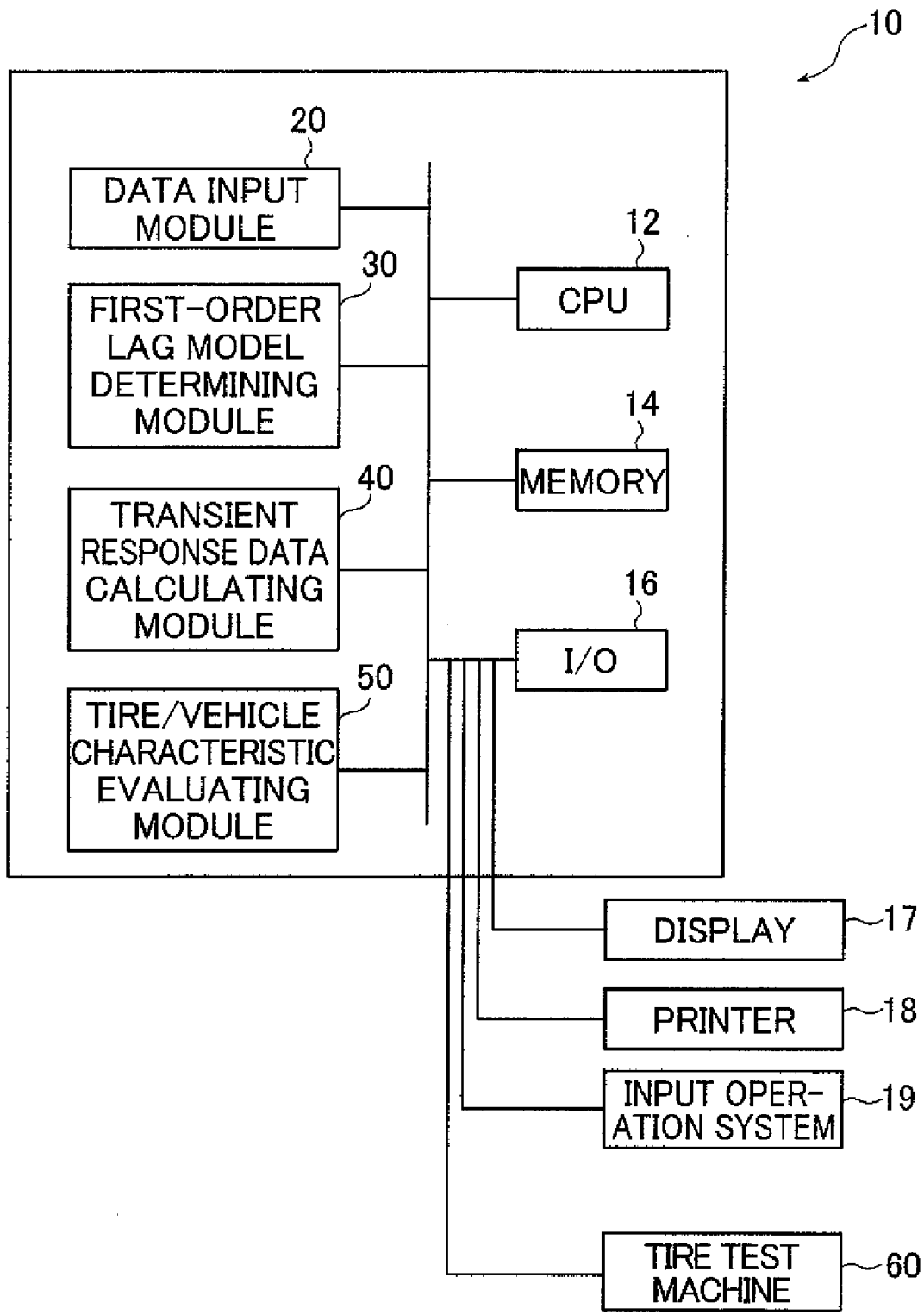
FIG. 1 is a block diagram of a computing unit that carries out a tire model determining method, a tire transient response data calculating method, and a tire evaluation method according to the present invention.

FIG. 1 is a block diagram of a computing unit 10, which carries out the tire model determining method, tire transient response data calculating method, tire evaluating method, and tire designing method of the present invention.

The present invention uses the computing unit 10 in a first embodiment and a second embodiment of the present invention which are described below. The first embodiment will be described first.

First Embodiment

The first embodiment deals with the implementation of: a tire model determining method for determining a first-order lag model which simulates a transient response of the longitudinal force of a tire from measurement data of the tire's longitudinal force which is obtained by giving the tire an increasing and decreasing slip ratio in the longitudinal direction of the tire; and a tire transient response data calculating method for calculating a transient response of a longitudinal force which is generated by giving a rolling tire a slip ratio that fluctuates in a desired manner in the longitudinal direction of the tire. In the first embodiment, a physical amount that sets a tire's rolling condition is a slip ratio in the longitudinal direction of the tire and measurement data of the tire's transient response is the tire's longitudinal force acting on the rotational axis of the tire.

The computing unit 10 determines a first-order lag model optimum for simulating a transient response of a longitudinal force that is generated by giving a rolling tire a slip ratio in the longitudinal direction of the tire, uses the first-order lag model to calculate time-series data of a transient response of a longitudinal force generated when a desired slip ratio is given to a tire that has been rolling at a constant slip ratio, and uses a time constant used in the first-order lag model and the calculated time-series data to evaluate characteristics of a tire and a vehicle. A tire longitudinal direction in the present invention is a direction that is parallel to a horizontal plane with which the tire is in contact and is orthogonal to a tire rotational axis of a tire rolling at a slip angle of 0° on the horizontal plane.

The computing unit 10 is built from a computer and has a CPU 12, a memory 14, and an I/O interface section 16. The computing unit 10 is also a device that provides a data input module 20, a first-order lag model determining module 30, a transient response data calculating module 40, and a tire/vehicle characteristic evaluating module 50 as sub-programs by reading and executing software stored in the memory 14. The computing unit 10 is connected to a display 17, a printer 18, and an input operation system 19 which includes a mouse, a keyboard, and the like.

The CPU 12 is a computing section which actually performs calculations of the respective modules. The memory 14 stores, in addition to software constituting the respective modules, data calculated in the modules and processing results of the modules. The I/O interface section 16 outputs data calculated in the modules and processing results of the modules to the display 17 and the printer 18, which are external devices.

The computing unit 10 is also connected to a tire test machine 60, which makes a tire actually roll to measure a lateral force or longitudinal force.

The data input module 20 obtains measurement data of a transient response of a tire's longitudinal force generated by giving the tire time-series data of a slip ratio in the longitudinal direction of the tire (hereinafter, referred to as slip ratio S(t)) as a measurement condition while keeping the slip angle and the applied load at given values. The data input module 20 further obtains, by receiving, given information as the need arises. The obtained measurement data and information are stored in the memory 14. Data is input to the data input module 20 through the I/O interface section 16.

Figure 2:
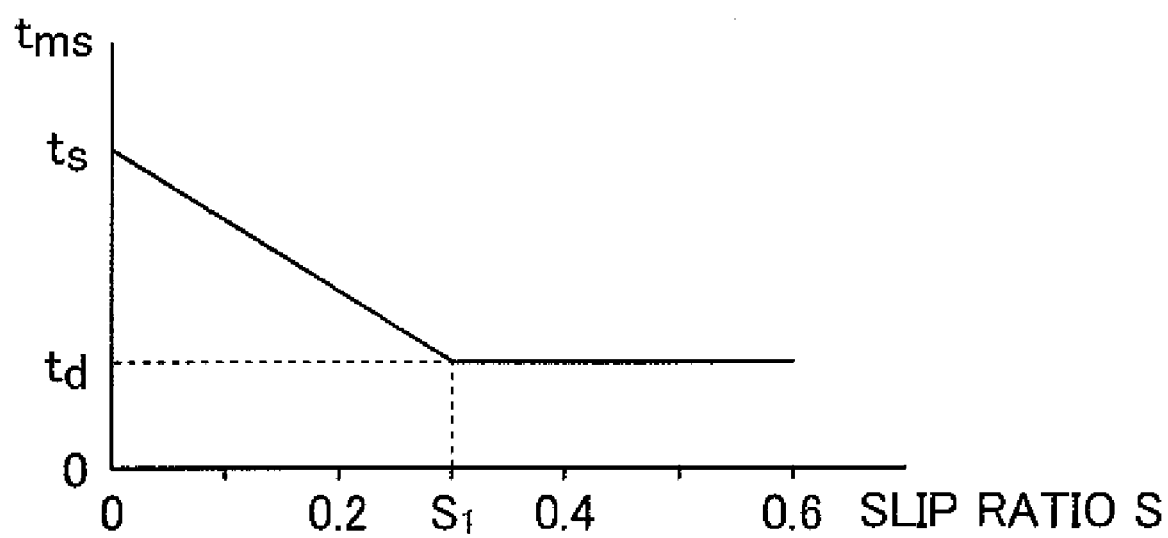
FIG. 2 is a diagram illustrating a time constant used in the computing unit of FIG. 1.

The first-order lag model determining module 30 uses the measurement data of the transient response of the longitudinal force (hereinafter, referred to as $F_x(t)$) to determine a time constant in a first-order lag model, and thereby determine a tire model expressed by the first-order lag model. A time constant in a first-order lag model is set in a manner that makes the time constant vary in accordance with the value of the slip ratio S(t). As shown in Expression (1) which will be described later, the first-order lag model determining module 30 obtains an effective slip ratio S'(t) by calculating a convolution integral of a response function of a first-order lag model which has a time constant $t_{ms}$ and the amount of time with change (time gradient) of the slip ratio S(t) that has been set (hereinafter, referred to as set slip ratio). The time constant $t_{ms}$ used in the calculation is a function Z(S). The function Z(S) is dependent on the set slip ratio S(t) given to the tire and changes in accordance with the set slip ratio S(t) as shown in FIG. 2. The function Z(S) is such a function that the time constant $t_{ms}$ reaches a maximum value $t_s$ when the set slip ratio is 0, monotonously decreases from the maximum value $t_s$ to a minimum value $t_d$ as the set slip ratio S(t) increases, and remains at the minimum value $t_d$ from then on. More specifically, the function Z(S) is such a function that the time constant $t_{ms}$ ranges between the maximum value $t_s$ and the minimum value $t_d$, takes the maximum value $t_s$ at a set slip ratio S(t) of 0, linearly decreases toward the minimum value $t_d$ as the set slip ratio S(t) increases, and remains at the minimum value $t_d$ as the set slip ratio S(t) increases further. The value of the set slip ratio $S_1$ at which the time constant $t_{ms}$ first reaches the minimum value $t_d$ as a result of increasing the set slip ratio S(t) is 0.3 to 0.5, which is about twice a slip ratio at which the actual longitudinal force of the tire reaches its highest peak. In the present invention, the monotonous decreasing of Z(S) from the maximum value $t_s$ to the minimum value $t_d$ may be a curved decrease instead of a linear decrease.

On the actual contact patch of the tire, the longitudinal force is generated solely by the adhesive frictional force when the slip ratio S is around 0 and, as the slip ratio S increases, the adhesive frictional force decreases whereas the sliding frictional force increases. The adhesive frictional force becomes substantially 0 when the slip ratio S reaches $S_1$, thus making the sliding frictional force dominant.

Accordingly, as the time constant $t_{ms}$ at a set slip ratio S(t) of 0 where the adhesive frictional force is substantially dominant, the present invention uses a time constant $t_s$ which is determined by the adhesive friction between a tread part of the tire and the contact patch. As the time constant $t_{ms}$ at a set slip ratio S(t) of $S_1$ or larger where the sliding frictional force is substantially dominant, the present invention uses a time constant $t_d$ which is determined by the sliding friction between the tread part of the tire and the contact patch. When the set slip ratio S(t) is between 0 and $S_1$ where the adhesive frictional force and the sliding frictional force are both present, the adhesive friction has a greater influence while the set slip ratio S(t) is small and the sliding friction influences more as the set slip ratio S(t) becomes larger. The time constant $t_{ms}$ is therefore changed (increased or decreased) linearly and monotonously between the time constant $t_s$ and the time constant $t_d$. The time constant $t_s$ which is determined by the adhesive friction between the tread part of the tire and the contact patch has a larger value than the time constant $t_d$ as will be described later, and accordingly makes the maximum value whereas the time constant $t_d$ makes the minimum value.

In short, Z(S) is used as the time constant $t_{ms}$ of the first-order lag response function as in Expression (1) described below.

A response function and measurement data of the longitudinal force as the ones described above are used to determine the time constants $t_s$ and $t_d$ of Z(S) which is the time constant $t_{ms}$, and a first-order lag is thus determined. Details will be described later.

The transient response data calculating module 40 obtains the response function of the first-order lag model which is determined in the first-order lag model determining module 30, obtains a least square regression curve $R_{ms}$ (S'(t)) which is calculated in determining the response function of the first-order lag model, and uses the response function and the least square regression curve $R_{ms}$ (S'(t)) to calculate a friction coefficient μ(t), which is time-series data of the response function, from an arbitrary set slip ratio S(t) input to the data input module 20.

The tire/vehicle evaluating module 50 inputs the friction coefficient μ(t) calculated in the transient response data calculating module 40 to a not-shown vehicle model to calculate the vehicle braking distance or the like and evaluate the tire.

Details of the processing of the respective modules will be given later in a description on a data processing method of the computing unit 10.

Figure 3:
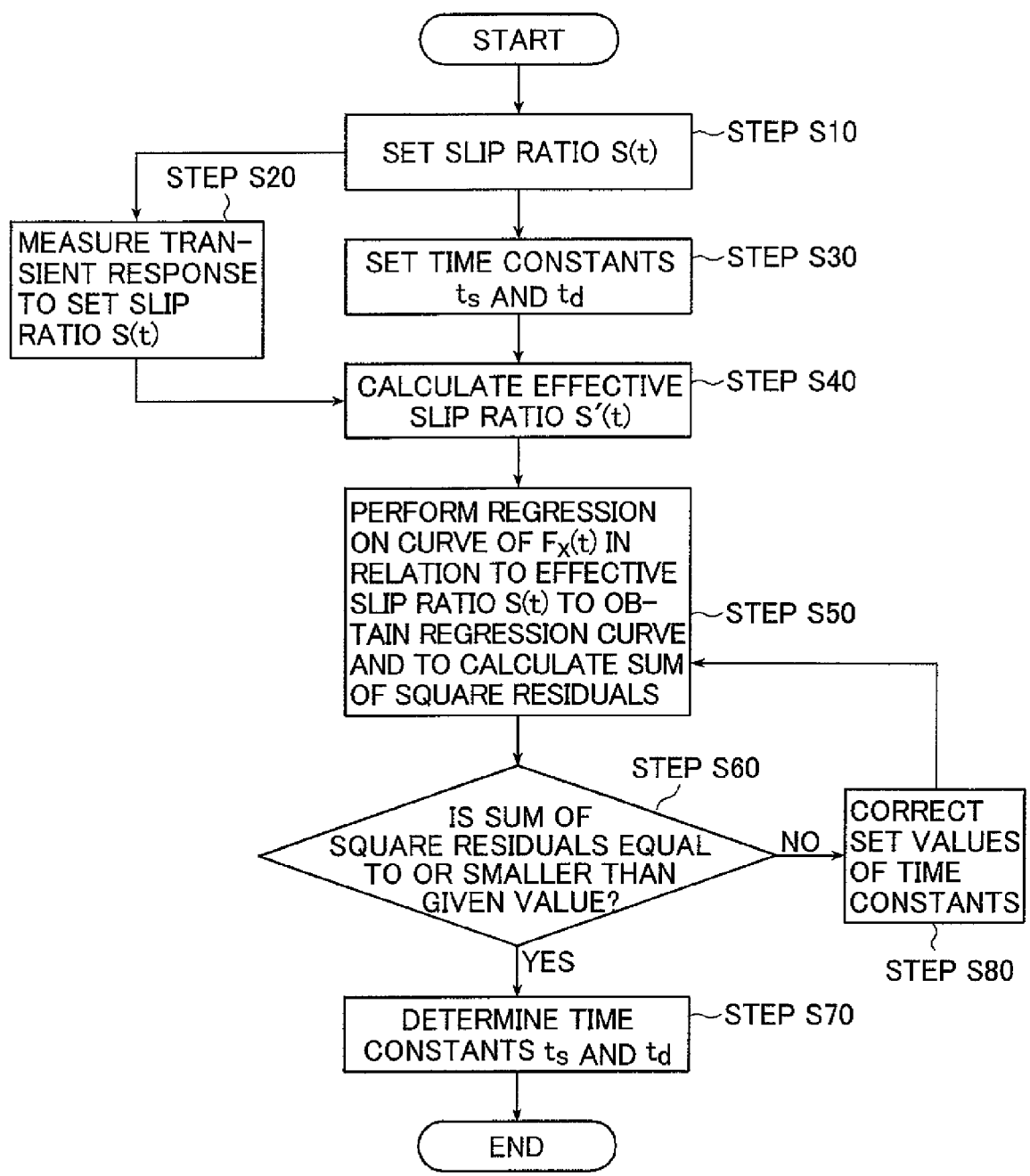
FIG. 3 is a flow chart showing an example of the flow of the tire model determining method according to the present invention.

FIG. 3 is a flow chart showing an example of the flow of a tire model determining method that is executed by the first-order lag model determining module 30 of the computing unit 10 according to the present invention.

The set slip ratio S(t) is first input to the data input module 20 through the input operation system 19 (Step S10). The slip ratio S(t) is supplied such that a braking force is generated as the longitudinal force of the tire. The set slip ratio S(t) is stored in the memory 14, which also stores information about a rolling speed V, an applied load, and other measurement conditions entered via the input operation system 19. The slip ratio S(t) in the present invention may be supplied to generate a driving force as the longitudinal force of the tire, but the following description deals with a case in which the slip ratio S(t) generates a braking force.

The set slip ratio S(t) and other input information are sent to the tire test machine 60. Based on the received information, the tire test machine 60 puts an actual tire into a rolling state at a slip angle of 0° and at the set applied load, measures the actual transient response of the longitudinal force at the set slip ratio S(t), and obtains $F_x(t)$ which is time-series data of the transient response of the longitudinal force (Step S20). $F_x(t)$ is stored in the memory 14 through the I/O interface section 16, and is read by the first-order lag model determining module 30.

Meanwhile, the first-order lag determining module 30 sets the time constants $t_s$ and $t_d$ in the following Expression (1) (Step S30). The time constant values set in Step S30 may be default values set in advance, or may be values entered by the operator through the input operation system 19. A response function of a first-order lag model is thus determined.

[Mathematical Expression 1]

$$t_{ms} = Z(S) = \begin{cases} -\frac{t_s - t_d}{S_1} \cdot S + t_s & (0 \leq S \leq S_1) \\ t_d & (S_1 < S) \end{cases} \quad (1)$$

Next, the effective slip ratio S'(t) is calculated by the following Expression (2) (Step S40).

Specifically, the effective slip ratio S'(t) is obtained as time-series data of the transient response by performing a convolution integral of the determined response function of the first-order lag model and the time gradient of the set slip ratio S(t). The time constant $t_{ms}$ in Expression (2) is Z(S) defined by Expression (1), and the set slip ratio S(t) is used for S in the right side of Expression (1).

[Mathematical Expression 2]

$$S'(t) = \int_{-\infty}^{t} \left[1 - \exp\left(\frac{t - t'}{t_{ms}}\right)\right] \cdot \frac{dS(t')}{dt'} dt' \quad (2)$$

The effective slip ratio S'(t) is calculated because the tire requires time to settle into a steady state after the set slip ratio S(t) of the tire changes in an instant, and it also takes time for the generated longitudinal force $F_x(t)$ of the tire, or for the friction coefficient μ(t) which is the quotient of the longitudinal force divided by a constant applied load, to reach an equilibrium state with respect to the set slip ratio S(t). The present invention therefore uses the response function of the first-order lag model to determine the effective slip ratio S'(t) that will put $F_x(t)$ or the friction coefficient μ(t) into an equilibrium state.

Next, a regression is performed on a characteristic curve that represents the dependency of the friction coefficient μ(t), which is obtained by dividing $F_x(t)$ measured in Step S20 by a constant applied load $F_z$, on the effective slip ratio S'(t). The regression uses a spline function to obtain a single smooth curve function, and the sum of square residuals between the curve function obtained in the regression and the characteristic curve is calculated (Step S50). The spline function is preferably a B-spline function, for example. The friction coefficient μ(t) which is the quotient of $F_x(t)$ divided by the constant applied load $F_z$ corresponds to the characteristic curve that represents values of the time-series data $F_x(S'(t))$ of the longitudinal force in relation to values of the effective slip ratio data S'(t).

To give a specific description on the above regression, when the B-spline function is expressed by $B_1(x)$, $B_2(x)$, $B_3(x)$ ... and the above single curve function is given as f(x), f(x) is expressed by a first-order linear combination of $B_1(x)$, $B_2(x)$, $B_3(x)$ ... as shown in the following Expression (3).

[Mathematical Expression 3]

$$f(x) = \sum_{i=1}^{m} \alpha_i B_i(x) \quad (3)$$

(*m* represents the number of nodes)

When the value of the single curve function obtained by the regression fluctuates in relation to the slip ratio S'(t), the difference between the values of coefficients $\beta_i$ and $\alpha_{i+1}$ in Expression (3) also fluctuates widely. The difference between the values of the coefficients $\alpha_i$ and $\alpha_{i+1}$ are prevented from fluctuating by supplying a constraint condition that a sum A of square adjacent differences expressed by Expression (4) is kept constant in the above regression which uses a spline function to obtain a single smooth curve function.

[Mathematical Expression 4]

$$A = \sum_{i=1}^{m-1} (a_{i+1} - a_i)^2 \quad (4)$$

Whether or not the calculated sum of square residuals is equal to or smaller than a given value is judged next (Step S60). When the calculated sum of square residuals is larger than the given value, the set values of the time constants $t_s$ and $t_d$ are corrected to modify the response function of the first-order lag model (Step S80), and Steps S50 and S60 are repeated. The Newton-Raphson method, for example, is employed in correcting the values of the time constants $t_s$ and $t_d$. In Step S60, whether or not the sum of square residuals is its minimum value may be judged instead of judging whether or not the sum of square residuals is equal to or smaller than a given value.

Lastly, the values of the time constants $t_s$ and $t_d$ at which the sum of square residuals reaches the given value or lower are determined as parameter values that define a first-order lag response model (Step S70). Also, the least square regression curve that makes the sum of square residuals equal to or smaller than the given value is determined as $R_{ms}(S'(t))$ in the following Expression (5). The determined values of the time constants $t_s$ and $t_d$ and the least square regression curve $R_{ms}(S'(t))$ are stored in the memory 14. The determined values of the time constants $t_s$ and $t_d$ and the least square regression curve that makes the sum of square residuals equal to or smaller than the given value are also output to the display 17 and the printer 18.

The effective slip ratio S'(t), which is calculated by using the first-order lag model as described above, matches the set slip ratio S(t) when the set slip ratio S(t) is a constant value (steady state). Then the least square regression curve $R_{ms}(S'(t))$ represents a characteristic curve that indicates the dependency of the longitudinal force on the applied load in a steady state.

[Mathematical Expression 5]

$$\mu = \frac{F_x}{F_z} = R_{ms}(S'(t)) \quad (5)$$

While this embodiment uses the time constants $t_s$ and $t_d$ both as parameters of the first-order lag response function, it is sufficient in the present invention if at least the time constant $t_s$ is used as a parameter and a value is determined for the time constant $t_s$. The time constant $t_d$ has a substantially constant value which is not varied much depending on the material of the tire's tread part or the like and which is very small compared to the value of the time constant $t_s$. The time constant $t_d$ therefore does not influence the effective slip ratio S'(t) so much. The value of time constant $t_d$ is set to a default value at 0.006 to 0.008, for example. Alternatively, the time constant $t_d$ is set to a value entered by the operator.

Figure 4:
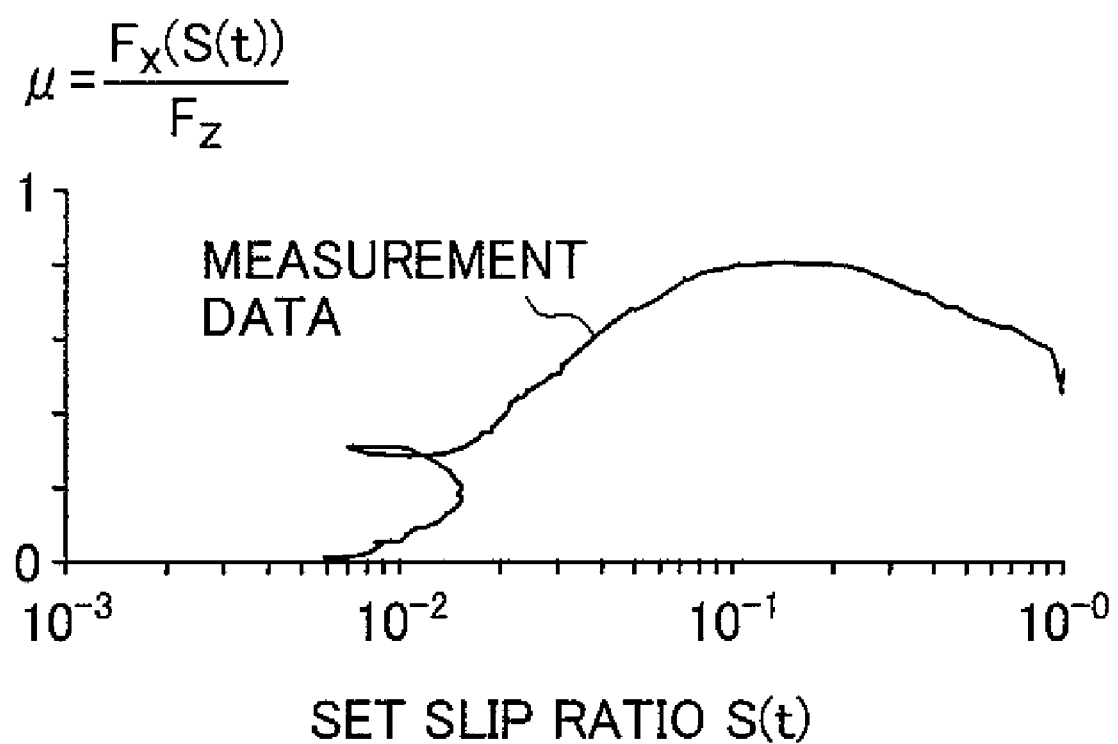
FIG. 4 is a diagram showing an example of data obtained by the tire model determining method that is shown in FIG. 3.

FIG. 4 is a graph with its axis of ordinate showing values (actual measurement data) of the friction coefficient μ(t), which is obtained by dividing, by the applied load, the time-series data $F_x(t)$ of a longitudinal force during transient response that acts on the actual tire, and with its axis of abscissa showing the set slip ratio S(t). The measurement conditions include using a tire 205/55 R16 89V in size, setting the applied load to 6 kN and the rolling speed V to 64 km/h, and testing the tire on a wet road surface. The axis of abscissa is represented in a log scale to make the behavior clear at almost t=0.

FIGS. 5A to 5C, on the other hand, are diagrams showing the relation between the time constant $t_s$ and the residual when the time constant $t_s$ alone is corrected as a parameter while fixing the time constant $t_d$ at 0.0074 second. FIG. 5A shows a curve obtained by a regression when the time constant $t_s$ has a value ($t_s$=0.001 second) smaller than its optimum value, and the distribution of residuals between the curve and data actually measured at the time. FIG. 5B shows a curve obtained by a regression when the time constant $t_s$ has the optimum value ($t_s$=0.0675 second), and the distribution of residuals between the curve and data actually measured at the time. FIG. 5C shows a curve obtained by a regression when the time constant $t_s$ has a value ($t_s$=0.3 second) larger than the optimum value, and the distribution of residuals between the curve and data actually measured at the time.

Figure 6:
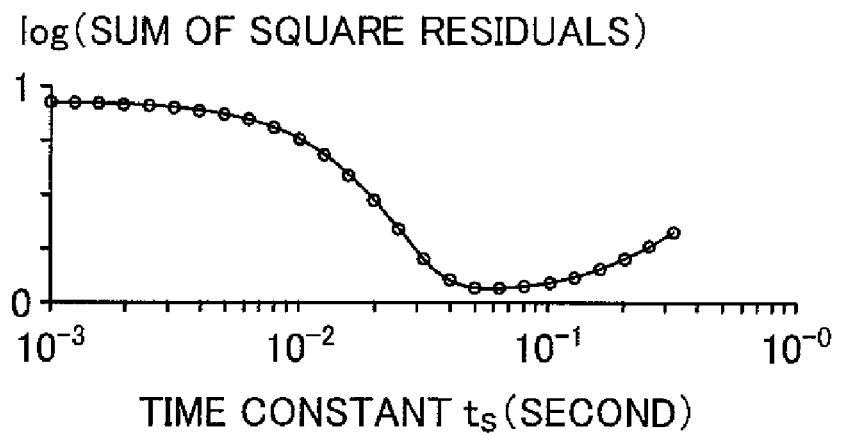
FIG. 6 is a diagram showing another example of data obtained by the tire model determining method that is shown in FIG. 3.

FIG. 6 is a diagram showing how the sum of square residuals changes in relation to the time constant $t_s$. It is understood from FIG. 6 that the sum of square residuals takes a minimum value when the time constant $t_s$ is 0.0575 second and, accordingly, the optimum value of the time constant $t_s$ is 0.0575 second.

Figure 7:
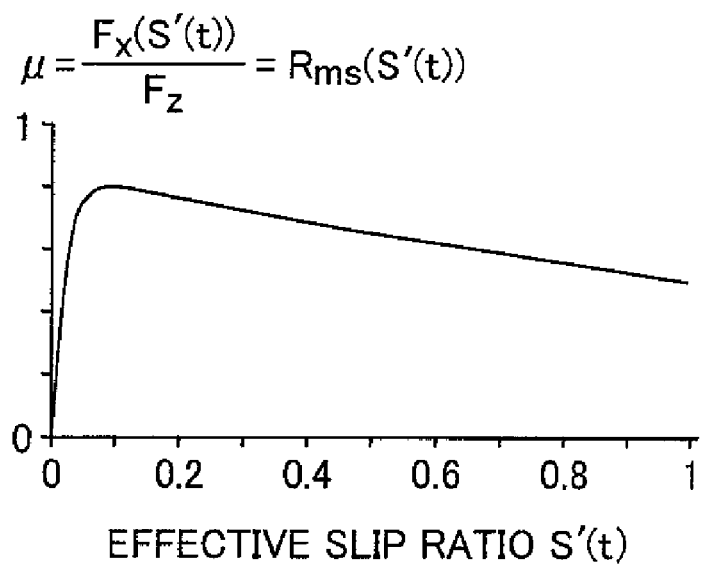
FIG. 7 is a diagram showing an example of a least square regression curve obtained by the tire model determining method that is shown in FIG. 3.

FIG. 7 shows the least square regression curve $R_{ms}(S'(t))$ when the time constant $t_s$ is 0.0575 second and the time constant $t_d$ is 0.0074 second. The present invention uses these time constants ($t_s$=0.0575 second, $t_d$=0.0074 second) and least square regression curve $R_{ms}(S'(t))$ in a tire transient response data calculating method described later.

FIGS. 8A to 8D show various types of data as a result of performing the processing of FIG. 3 on time-series data of a longitudinal force in a transient response state that is obtained by running a tire 195/65 R15 in size on a wet road surface at an applied load of 6 kN and a rolling speed of 64 km/h.

Figure 8A:
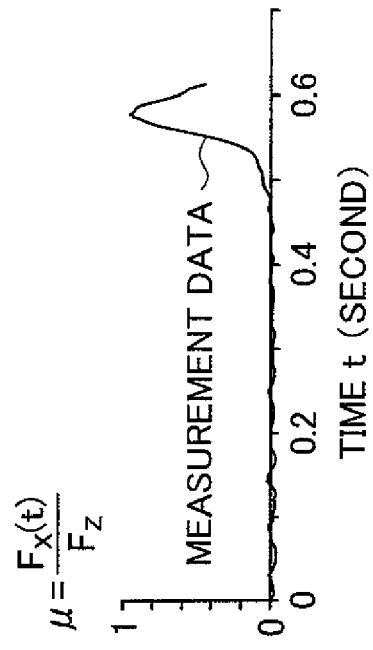
FIGS. 8A to 8D are diagrams showing examples of various types of data obtained through the flow that is shown in FIG. 3.
Figure 8C:
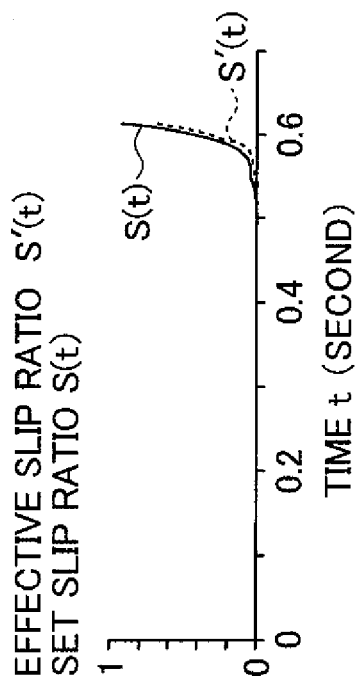
Figure 8B:
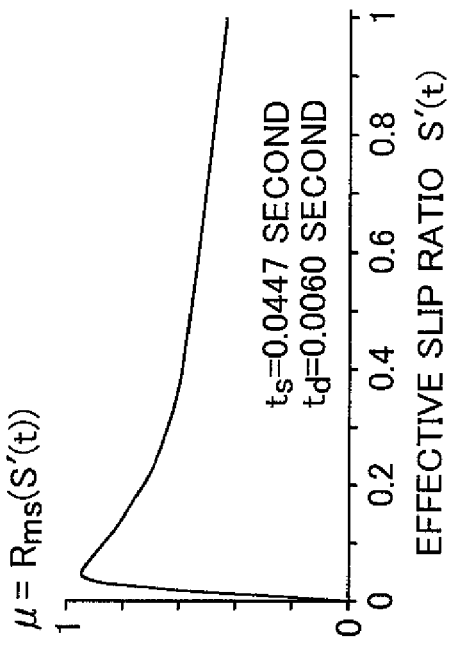
Figure 8D:
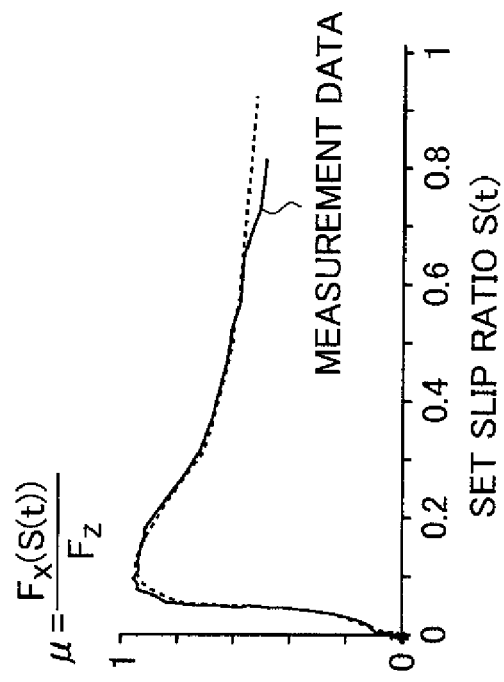

FIG. 8A shows the set input slip ratio S(t) along with the effective slip ratio S'(t) at which the time constants have optimum values (the time constant $t_s$=0.0447 second, $t_d$=0.0060 second). FIG. 8B shows the friction coefficient μ (actually measured data) obtained by dividing the longitudinal force $F_x(t)$ at the time by a constant applied load $F_z$ (=6 kN). FIG. 8C shows the friction coefficient μ(S(t)) when the axis of abscissa represents the set slip ratio S(t) and when the time constants $t_s$ and $t_d$ are 0.0447 second and 0.0060 second, respectively. FIG. 8D shows the least square regression curve $R_{ms}(S'(t))$ when the time constants $t_s$ and $t_d$ have optimum values, 0.0447 second and 0.0060 second, respectively, where the sum of square residuals is minimum.

The present invention also uses these time constants ($t_s$=0.0447 second, $t_d$=0.0060 second) and least square regression curve $R_{ms}(S'(t))$ in the tire transient response data calculating method described later.

Figure 9:
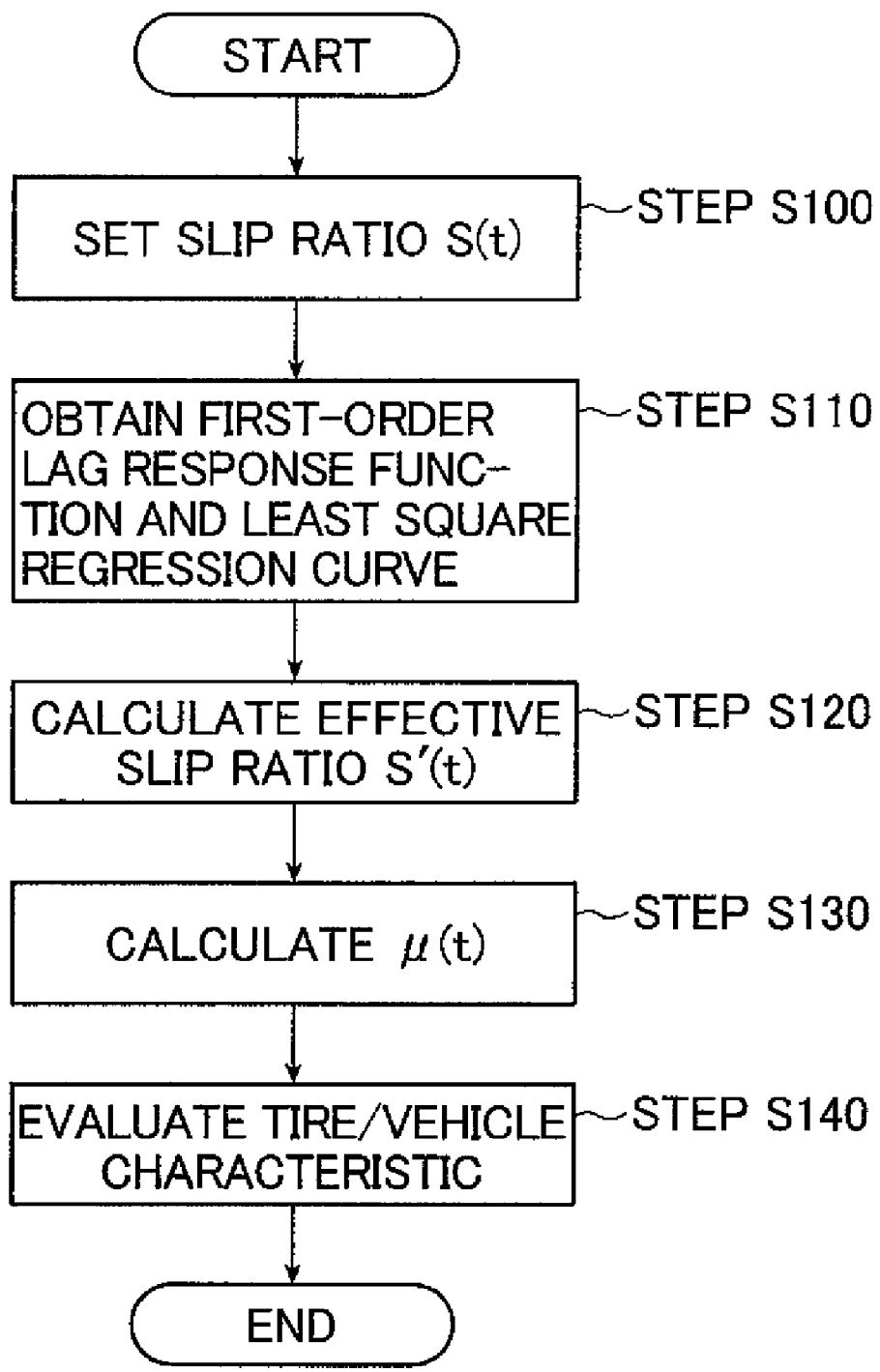
FIG. 9 is a flow chart showing the flow of an embodiment of the tire transient response data calculating method according to the present invention.

FIG. 9 is a flow chart showing the flow of an embodiment of a tire transient response data calculating method according to the present invention. The tire transient response data calculating method is for obtaining the friction coefficient μ(t) by sequentially calculating a friction coefficient under a condition that the applied load $F_z$ is constant while incrementing a time steps with the time width set to constant Δt.

First, the operator enters and sets a desired slip ratio S(t) through the input operation system 19 (Step S100). The entered set slip ratio S(t) is stored in the memory 14.

Next, the transient response data calculating module 40 obtains the time constants $t_s$ and $t_d$, which determine the time constant $t_{ms}$ of a first-order lag model, and the least square regression curve $R_{ms}(S'(t))$ by reading them out of the memory 14.

The effective slip ratio S'(t) is then calculated by the above Expression (2) (Step S120).

For the time constant $t_{ms}$ used in the calculation of the effective slip ratio S'(t), an effective slip ratio S'(t−Δt) one time step prior is employed instead of the set slip ratio S(t) shown in the above Expression (1). The effective slip ratio S'(t−Δt) is employed instead of the set slip ratio S(t) because the effective slip ratio S'(t−Δt) reproduces the ratio of the adhesive frictional force to the sliding frictional force on the contact patch during a transient state, compared to the set slip ratio S(t).

Next, the least square regression curve $R_{ms}(S'(t))$ is applied to the calculated effective slip ratio S'(t) to calculate μ(t) (Step S130). μ(t) is easily calculated by substituting the value of the effective slip ratio' S(t) into the least square regression curve $R_{ms}(S'(t))$ because the least square regression curve $R_{ms}(S'(t))$ is expressed as a function. The calculated μ(t) is stored in the memory 14 along with the set slip ratio S(t) and the effective slip ratio S'(t).

The thus calculated tire transient response data, μ(t), is used in evaluation of tire/vehicle characteristics.

The tire/vehicle characteristic evaluating module 50 reads the stored μ(t), set slip ratio S(t), and effective slip ratio S'(t) out of the memory 14, and supplies the read μ(t) to the vehicle model to evaluate tire/vehicle characteristics (Step S140). Results of the tire/vehicle characteristics evaluation are output to the display 17 and the printer 18.

For instance, the vehicle model is used for a vehicle deceleration simulation. A vehicle model in the present invention may be an analysis model that calculates a change with time of the traveling speed when the friction coefficient μ(t) acts on an object that travels at a constant speed, or may be a two-wheel model, or may be a four-wheel model created with the use of commercially available software such as ADAMS (a product of SMC, Inc.), CarSim (a product of Virtual Mechanics Corporation), or veDYNA (a product of Neorium Technology CO., LTD.). If tire/vehicle characteristics are evaluated by fixing a vehicle model and supplying μ(t) about multiple tires to the vehicle model, a comparative evaluation can be made among these multiple tires.

The calculated data is stored in the memory 14 and output to the display 17 and the printer 18.

FIGS. 10A to 10E are diagrams showing examples of various types of data obtained through the flow that is shown in FIG. 9.

FIG. 10A shows an example of the set slip ratio S(t) which is set to a desired value in Step S100. The set slip ratio S(t) is actually measured data of a slip ratio given to the tire by the anti lock brake system (ABS) of the actual vehicle upon braking. In contrast to this set slip ratio S(t), the effective slip ratio S'(t) calculated in Step S120 is shown in FIG. 10B. The examples of the effective slip ratio S'(t) shown in FIG. 10B are ones when the time constant $t_s$ is 0.01 second and 0.1 second while the time constant $t_d$ is fixed to 0.0074 second. The behavior of the effective slip ratio S'(t) is smoother when the time constant $t_s$ is 0.1 second than when the time constant $t_s$ is 0.01 second.

FIG. 10C shows a result of calculating the friction coefficient μ(t) with the use of the not-shown least square regression curve $R_{ms}(S'(t))$. FIG. 10D shows the behavior of the friction coefficient μ(S(t)) when the axis of abscissa represents the set slip ratio S(t).

FIG. 10E shows a result of a vehicle deceleration simulation that uses the friction coefficient μ(t) shown in FIG. 10C to simulate the vehicle running speed when the above set slip ratio S(t) is given to a vehicle running at 100 km/h. In FIG. 10E, the axis of ordinate shows the vehicle running speed and the axis of abscissa shows time. It is understood from FIG. 10E that the vehicle running speed decelerates quicker when the time constant $t_s$ is 0.01 second than when the time constant $t_s$ is 0.1 second. Then it can be evaluated that the tire exhibits a superior braking characteristic when $t_s$ is 0.01 second to when the time constant $t_s$ is 0.1 second.

In the present invention, when designing a tire, the above-described tire/vehicle characteristic evaluation is performed on a test tire which serves as a basis, and the components of the test tire are adjusted according to results of the evaluation. A tire design improved from the test tire which serves as a basis is thus obtained. For example, when the time constant $t_s$ is 0.1 second in the test tire serving as a basis, the test tire is modified by switching to a tire tread member that brings the time constant $t_s$ to 0.01 second. Because the time constant $t_s$ is determined mostly by the rubber characteristic of the tire tread member when the road surface of the contact patch is the same, to adjust time constant $t_s$ and to switch the current tire tread member can be associated each other.

The above concludes the description of the first embodiment.

The second embodiment of the present invention is described next.

Second Embodiment

The second embodiment deals with the implementation of: a tire model determining method for determining a first-order lag model which simulates a transient response of the lateral force of a tire from measured transient response data of the tire's lateral force which is obtained by fixing the slip angle to a given value and giving the tire an increasing and decreasing applied load; and a tire transient response data calculating method for calculating a transient response of a lateral force which is generated by giving an applied load that fluctuates in a desired manner to a tire that is rolling with the slip angle kept constant. In the second embodiment, a physical amount that sets a tire's rolling condition is the applied load of the tire at a constant slip angle and measurement data of the tire's transient response is a lateral force acting on the rotational axis of the tire at a slip angle of 1 degree, in short, the cornering power (hereinafter, referred to as CP).

As in the first embodiment, the computing unit 10 shown in FIG. 1 is used in the second embodiment.

The computing unit 10 in the second embodiment determines a first-order lag model optimum for an accurate simulation of a transient response of a lateral force that is generated by giving a fluctuating applied load to a tire that is rolling with the slip angle kept constant, uses the first-order lag model to calculate time-series data of a transient response of a lateral force generated when a desired applied load fluctuation is given to a tire that is rolling at a constant slip angle, and uses a first-order lag time constant (hereinafter, referred to as time constant) used in the first-order lag model and the calculated time-series data to evaluate characteristics of a tire and a vehicle.

The data input module 20 in the second embodiment obtains measured transient response data of a tire's lateral force by fixing the slip angle to a given value and giving a tire, as a measurement condition, time-series data of the applied load which indicates an increase/decrease in applied load (hereinafter, referred to as set applied load Fz(t)). The data input module 20 further obtains a proportionality constant and other similar information and various types of data as the need arises. The measurement data and other obtained information are stored in the memory 14. Data is input to the data input module 20 through the I/O interface section 16. The following description takes CP, which is a lateral force at a slip angle of 1 degree, as a representative example.

The first-order lag model determining module 30 in the second embodiment uses the measurement data of the transient response of the CP (hereinafter, referred to as CP(t)) to determine a time constant in a first-order lag model, and thereby determine a tire model expressed by the first-order lag model. A time constant in a first-order lag model is set in a manner that makes the time constant vary in accordance with the value of the CP. As shown in Expression (6) which will be described later, the first-order lag model determining module 30 obtains an effective applied load Fz'(t) by calculating a convolution integral of a response function of a first-order lag model which has a time constant and the time gradient of the set applied load Fz (t) that has been set. The time constant used in the calculation is A·CP (A is a proportionality constant).

A change in CP(t) which is measurement data of the transient response takes place later than a change in set applied load Fz (t) because deformation of a contact portion of the tire tread part requires a finite time. The time required for the deformation is in proportion to the deformation amount of the contact portion of the tire tread part, and the deformation amount in turn is substantially in proportion to the CP at the time or the square of the contact length at the time. Accordingly, the time required for the deformation can be regarded as being in proportion to the CP or a square of the contact length l in a tire model. Thus A·CP is employed as a time constant in a first-order lag response function as in Expression (6) described below. The symbol A represents a proportionality constant.

A response function and measurement data of the CP as the ones described above are used to determine the value of the proportionality constant A of A·CP which is a time constant, and a first-order lag is thus determined. Details will be described later.

The transient response data calculating module 40 in the second embodiment reads out, from the memory 14, the response function of the first-order lag model determined in the first-order lag model determining module 30 and a least square regression curve Rcp(Fz'(t)), which represents the dependency of CP(t) obtained in determining the response function of the first-order lag model on the effective applied load. The transient response data calculating module 40 uses these response function and least square regression curve Rcp(Fz'(t)) to calculate the time-series data CP(t) of the response function from a desired value of the set applied load Fz(t) input to the data input module 20.

The tire/vehicle characteristic evaluating module 50 in the second embodiment uses CP(t) calculated in the transient response data calculating module 40 and a vehicle model to calculate time-series data of a stability factor Ks and time-series data of a natural yawing frequency Fn which serve as indicators of a vehicle's cornering characteristic, and thus evaluates a tire and a vehicle.

Details of the processing of the respective modules will be given later in a description on a data processing method of the computing unit 10.

Figure 11:
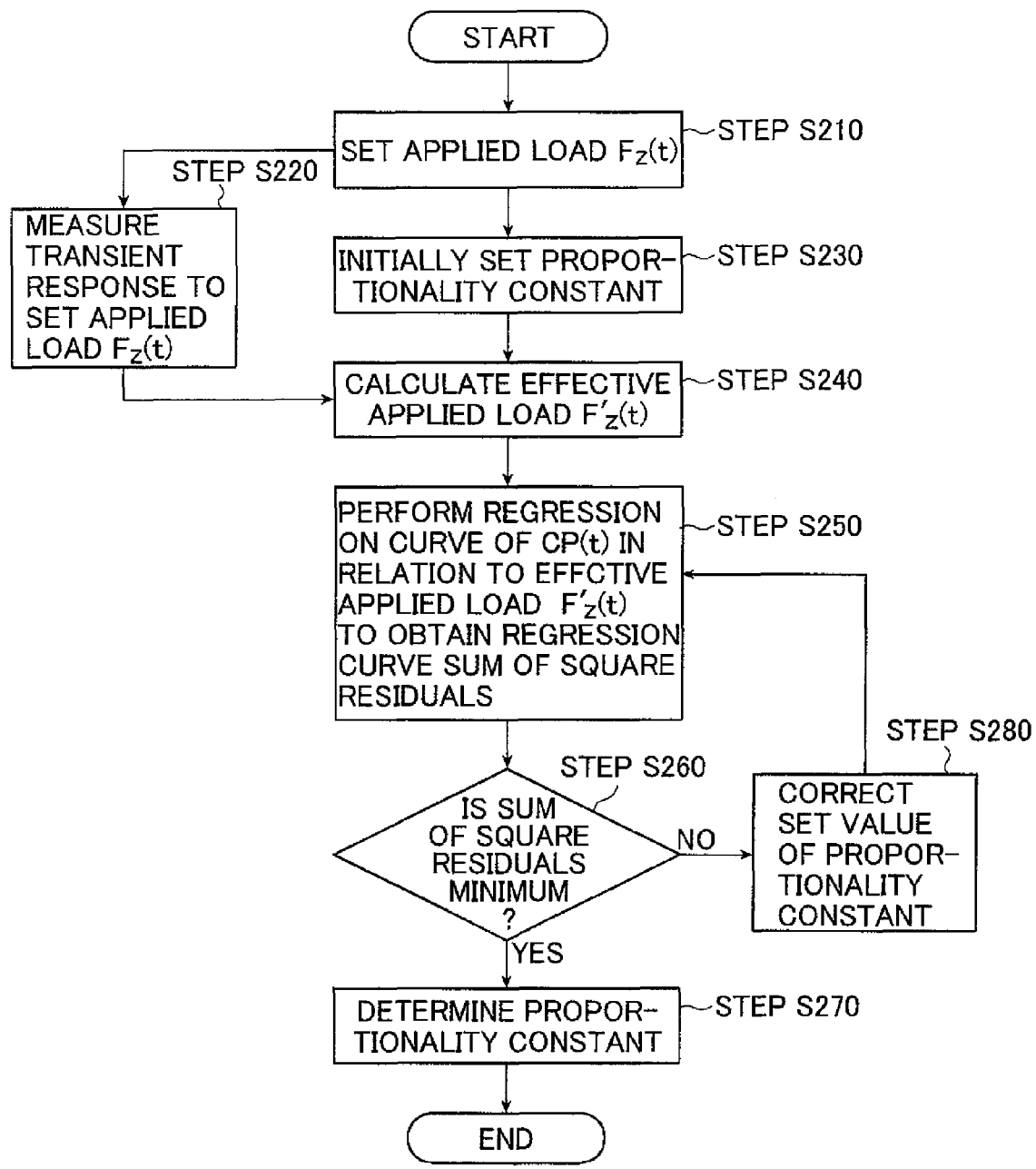
FIG. 11 is a flow chart showing another example of the flow of the tire model determining method according to the present invention.

FIG. 11 is a flow chart showing an example of the flow of a tire model determining method that is executed by the first-order lag model determining module 30 of the computing unit 10 according to the present invention.

The set applied load Fz(t) is first input to the data input module 20 through the input operation system 19 (Step S210). The set applied load Fz(t) is stored in the memory 14, which also stores information about measurement conditions entered via the input operation system 19 and including the rolling speed V and a slip angle of 1 degree. The set applied load Fz(t) and other input information are sent to the tire test machine 60. Based on the received information, the tire test machine 60 puts an actual tire into a rolling state at a slip angle of 1 degree, measures the actual transient response of the CP at the set applied load Fz(t), and obtains CP(t) (Step S220). CP(t) which is time-series data of the CP is sent to the computing unit 10 to be stored in the memory 14 through the I/O interface section 16, and is read by the first-order lag model determining module 30.

Meanwhile, the first-order lag determining module 30 initially sets the proportionality constant A in the following Expression (6) (Step S230). The proportionality constant value set initially in Step S230 may be default values set in advance, or may be a value entered through the input operation system 19. A response function of a first-order lag model is thus determined.

[Mathematical Expression 6]

$$F_z'(t) = \int_{-\infty}^{t} \left[1 - \exp\left(\frac{t-t'}{A \cdot CP(t)}\right)\right] \cdot \frac{dF_z(t')}{dt'} dt' \quad (6)$$

Next, the effective applied load Fz'(t) is calculated according to the above Expression (6) (Step S240).

Specifically, the effective applied load Fz'(t) is obtained as time-series data of the transient response by performing a convolution integral of the determined response function of the first-order lag model and the time gradient of the set applied load Fz(t). The CP in Expression (6) is CP(t) obtained in Step S220.

The effective applied load Fz'(t) is calculated because the tire requires time to settle into a steady state after the set applied load Fz(t) of the tire changes in an instant, and it also takes time for the tire's lateral force CP(t) generated at a slip angle of 1 degree to reach an equilibrium state with respect to the set applied load Fz(t). The present invention therefore uses the response function of the first-order lag model to determine the effective applied load Fz'(t) while CP(t) will be put into an equilibrium state with the effective applied load Fz'(t).

Next, a regression is performed on a characteristic curve that represents the dependency of CP(t), which is measured in Step S220, on the effective applied load Fz'(t). The regression uses a spline function to obtain a single smooth curve function, and the sum of square residuals between the obtained curve function and the characteristic curve is calculated (Step S250). The spline function is preferably a B-spline function, for example.

Whether or not the calculated sum of square residuals is smaller than a given value and at the same time is a minimum value is judged next (Step S260). When the calculated sum of square residuals is not minimum, the set value of the proportionality constant A is corrected to modify the response function of the first-order lag model (Step S280). Steps S250 and S260 are then repeated. The Newton-Raphson method, for example, is employed in correcting the value of the proportionality constant A.

Lastly, the value of the proportionality constant A at which the sum of square residuals reaches its minimum value is determined as a proportionality constant that defines a first-order lag response model (Step S270). Also, the least square regression curve that minimizes the sum of square residuals is determined as Rcp(Fz'(t)) in the following Expression (7). The determined value of the proportionality constant A and the least square regression curve Rcp(Fz'(t)) are stored in the memory 14.

The determined value of the proportionality constant A and the least square regression curve that minimizes the sum of square residuals are also output to the display 17 and the printer 18.

The effective applied load Fz'(t), which uses a first-order lag model as described above, matches the set applied load Fz(t) when the set applied load Fz(t) is a constant value (steady state). Then the least square regression curve Rcp(Fz'(t)) represents a characteristic curve that indicates the dependency of the CP on the applied load in a steady state.

[Mathematical Expression 7]

$$CP(t) = R_{cp}(F_z'(t)) \quad (7)$$

FIGS. 12A to 12D and FIG. 13 are diagrams showing examples of various data obtained by the method described above.

Figure 12A:
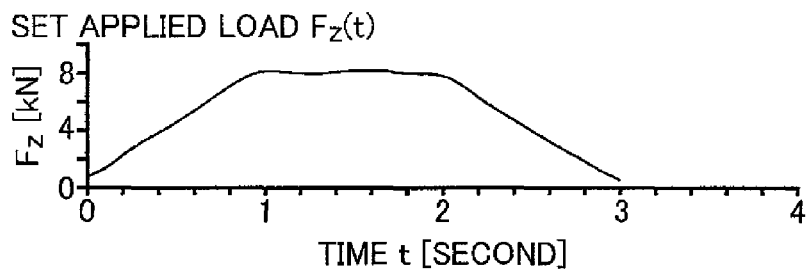
FIGS. 12A to 12D are diagrams showing examples of various types of data obtained by the tire model determining method that is shown in FIG. 11.
Figure 12B:
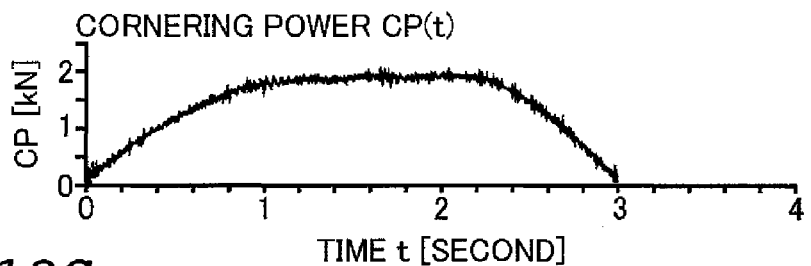
Figure 12C:
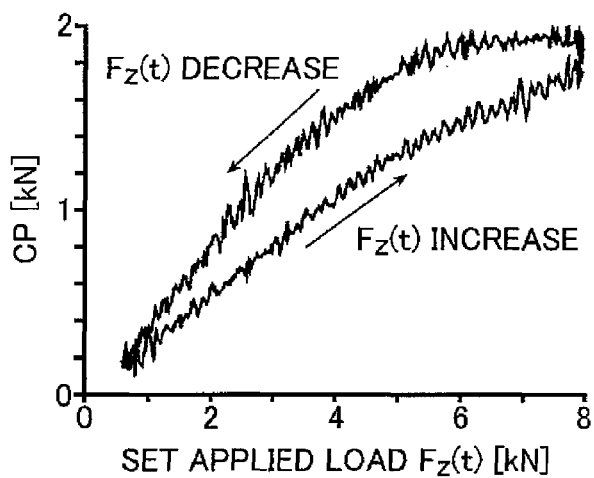

FIG. 12A shows an example of the set applied load Fz(t) which is set in Step S210. Desirably, the applied load Fz(t) is set such that at least the applied load increases and decreases. FIG. 12B is a diagram showing an example of CP(t) that is actually measured at the set applied load Fz(t) under measurement conditions including using a tire that is 205/55 R16 89V in size and 16×6.5 JJ in rim size, and setting the internal pressure to 200 kPa and the rolling speed to 10 km/h. A characteristic curve that indicates the dependency of this CP(t) on Fz(t) is shown in FIG. 12C. According to FIG. 12C, the CP cannot follow the set applied load Fz(t) and therefore takes different paths from when Fz(t) increases to when Fz(t) decreases, thereby forming two characteristic curves that constitute a hysteresis loop. The CP in a steady state forms a single characteristic curve irrespective of an increase or decrease in set applied load Fz(t). On the other hand, CP(t) does not form a single characteristic curve as shown in FIG. 12C because CP(t) which does not follow the set applied load Fz(t) is generated out of an equilibrium state. The present invention therefore uses a response function of a first-order lag model to determine the effective applied load Fz'(t) with which CP(t) will be put in an equilibrium state, and thereby calculates the proportionality constant A such that CP(t) forms a single characteristic curve in relation to the effective applied load Fz'(t).

Figure 12D:
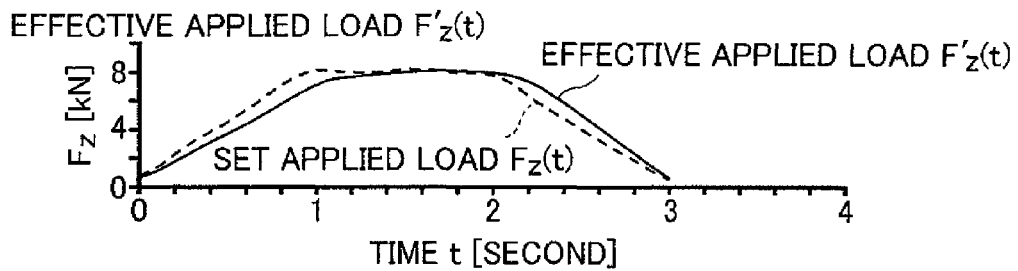

FIG. 12D is a diagram showing the effective applied load Fz'(t) when CP(t) forms a single characteristic curve in relation to the effective applied load Fz'(t). In FIG. 12D, a broken line indicating the set applied load Fz (t) is overlaid on a solid line indicating the effective applied load Fz'(t). The effective applied load Fz'(t) follows the set applied load Fz(t) with a delay.

Figure 13:
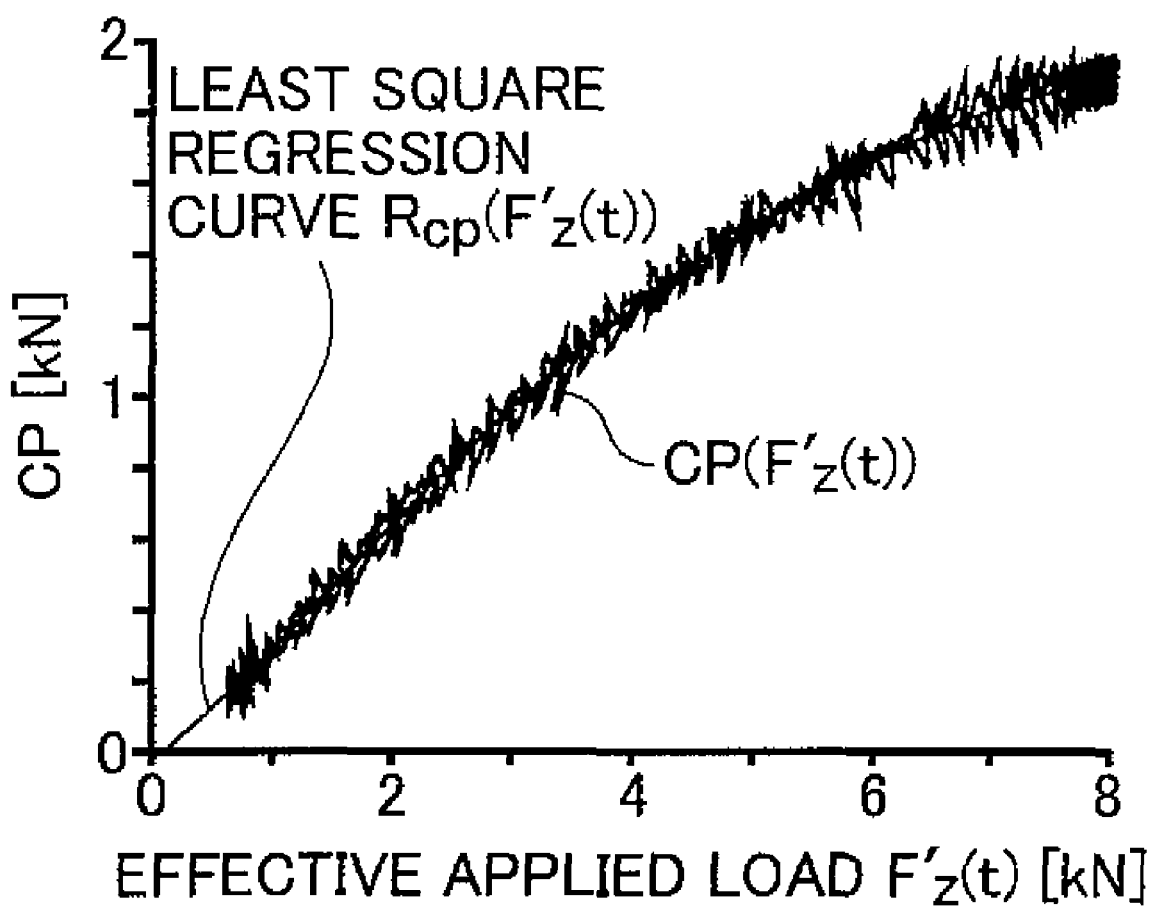
FIG. 13 is a diagram showing another example of data obtained by the tire model determining method that is shown in FIG. 11.

FIG. 13 shows an example of the least square regression curve Rcp(Fz'(t)) obtained through curve fitting by using CP(Fz'(t)), which is a characteristic curve of CP(t) in relation to the effective applied load Fz'(t), and a B-spline function. A comparison with the characteristic curve of FIG. 12C makes it clear that the characteristic curve CP(Fz'(t)) is approximated to a substantially single characteristic curve without forming a hysteresis loop. The value of the proportionality constant A in this example is 0.0977 second/kN, and the time constant is 0.123 second when the effective applied load is 4 kN.

The above embodiment employs A·CP as the time constant in the response function of the first-order lag model, but it is also possible in the present invention to set the time constant such that the time constant is in proportion to the square of the contact length l ($=l^2$) which is varied in accordance with the set applied load Fz(t). In short, the time constant may be set to B·$l^2$(Fz(t)) as shown in the following expression (8). The contact length l is stored in the memory 14 in advance by obtaining data of a contact length for each applied load while the tire is not rolling.

[Mathematical Expression 8]

$$F'_z(t) = \int_{-\infty}^{t} \left[1 - \exp\left(\frac{t-t'}{B \cdot l^2(F_z(t))}\right)\right] \cdot \frac{dF_z(t')}{dt'} dt' \quad (8)$$

The contact length data is read out of the memory 14 when calculating the effective applied load Fz'(t), the contact length l that is associated with the set applied load Fz(t) is obtained, and the contact length l is used together with the initially set value of a proportionality constant B to calculate the effective applied load Fz'(t) according to Expression (8).

The contact length l becomes longer as the applied load increases, and a larger lateral force is generated as the contact patch gains a larger area. The mechanism of the generation of the lateral force is as follows: The tire tread part comes into contact with the ground and is fixed to the ground by adhesion. Thereafter, as the tire begins to move, the belt part is displaced laterally in an amount according to the slip angle, causing shear deformation in the tread part. The sum of shearing forces generated by this shearing deformation is the lateral force and corresponds to the CP at a slip angle of 1 degree. It is therefore considered that, when the set applied load Fz(t) fluctuates, the time required for the CP to reach an equilibrium state corresponding to the shearing deformation is in proportion to an increase or decrease in shearing deformation amount which is caused by a fluctuation of the set applied load Fz(t). The increase/decrease is in proportion to the square of the contact length l and, accordingly, the time constant of the first-order lag model can be set such that the time constant is in proportion to the square of the contact length l ($=l^2$).

A response function that uses the thus obtained time constant is used to calculate the effective applied load Fz'(t) by Expression (8), and a least square regression curve Rl(Fz'(t)) expressed by the following Expression (9) is calculated in the same manner as Rcp(Fz'(t)).

The subsequent flow is identical with the one shown in FIG. 11, and the description is omitted here.

[Mathematical Expression 9]

$$CP(t) = R_l(F'_z(t)) \quad (9)$$

A response function of a first-order lag model obtained in the manner described above, a proportionality constant in a time constant of the response function, to be exact, can be used together with the least square regression curve Rcp(Fz'(t)) to calculate CP(t) of the transient response for an arbitrary value of the set applied load Fz(t) that is entered by the operator.

Described next is an embodiment that uses Expression (6), but the following description on the tire transient response data calculating method of the present invention also applies to a case in which Expression (8) is used.

Figure 14:
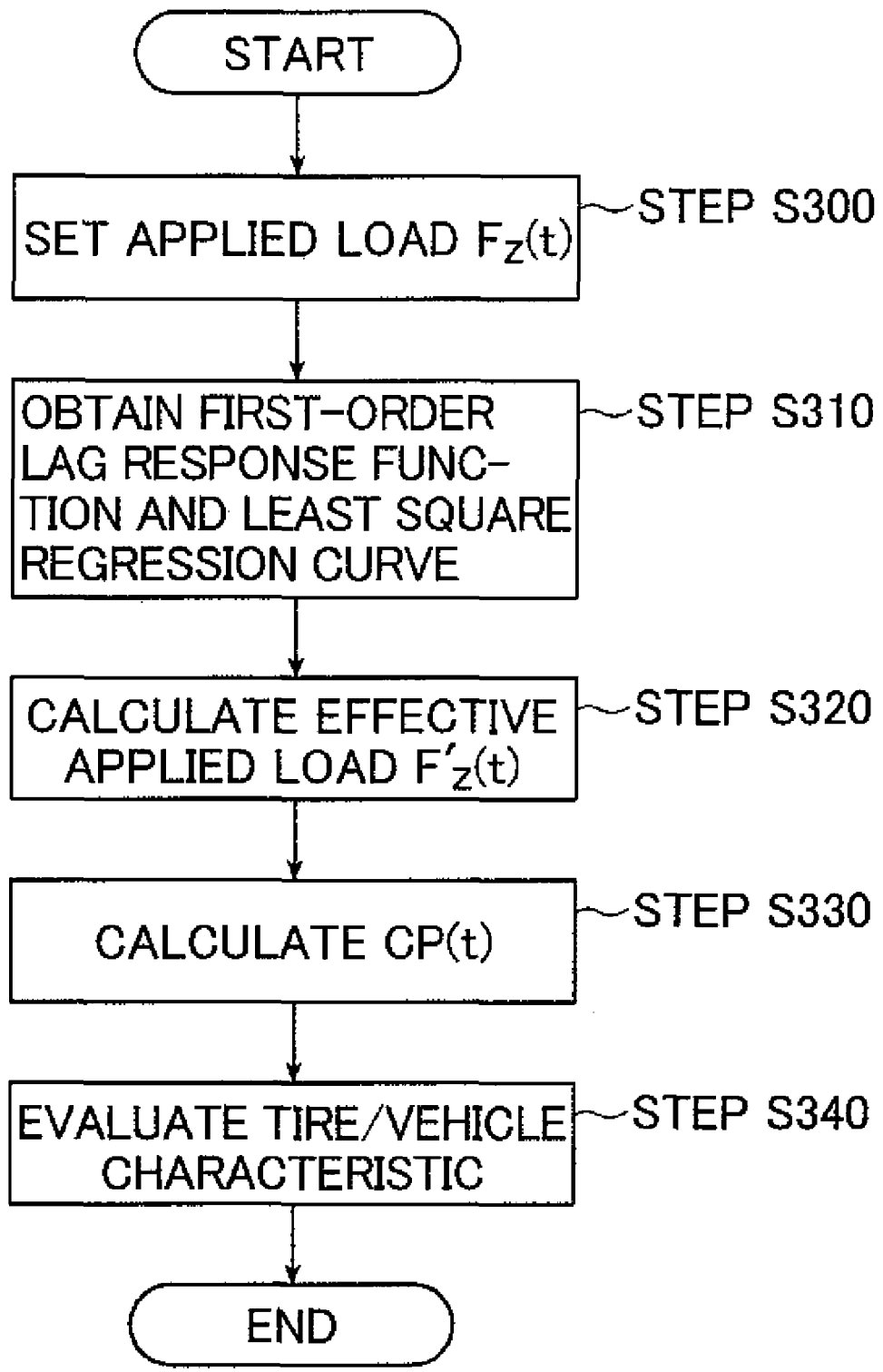
FIG. 14 is a flow chart showing the flow of another embodiment of the tire transient response data calculating method according to the present invention.

FIG. 14 is a flow chart showing the flow of an embodiment of a tire transient response data calculating method according to the present invention. The tire transient response data calculating method is for obtaining CP(t) by sequentially calculating the CP while incrementing a time step by the time width set to constant Δt.

First, the operator enters and sets a desired set applied load Fz(t) through the input operation system 19 (Step S300). The entered set applied load Fz(t) is stored in the memory 14.

Next, the transient response data calculating module 40 obtains the proportionality constant, which is used for the time constant of a first-order lag model, and the least square regression curve Rcp(Fz'(t)) by reading them out of the memory 14 (Step S310).

The effective applied load Fz'(t) is then calculated according to the above Expression (6) (Step S320).

The calculation of the effective applied load Fz'(t) uses CP(t) as a portion of the time constant. However, CP(t) is an unknown value which is to be calculated. The present invention utilizes the fact that the CP is sequentially calculated while incrementing a time step by the time width set to constant Δt, and uses CP(t−Δt) calculated one time step prior in place of CP(t).

Next, the least square regression curve Rcp(Fz'(t)) is applied to the calculated effective applied load Fz'(t) to calculate CP(t) (Step S330). CP(t) is easily calculated by substituting the effective applied load Fz'(t) into the least square regression curve Rcp(Fz'(t)) because the least square regression curve Rcp(Fz'(t)) is expressed as a function. The calculated CP(t) is stored in the memory 14.

The thus calculated tire transient response data, which is CP(t), is used in evaluation of tire/vehicle characteristics.

While this embodiment uses A·CP as the first-order lag time constant in the first-order lag model, the first-order lag time constant may be B·$l^2$ as in Expression (8). In this case, the effective applied load Fz'(t−Δt) which has been calculated one time step prior is used for the contact length.

The tire/vehicle characteristic evaluating module 50 reads the stored CP(t) and set applied load Fz(t) out of the memory 14, and applies the read data to a vehicle model to evaluate tire/vehicle characteristics (Step S340).

Specifically, the set applied load Fz(t) is given to a front wheel and rear wheel of the vehicle model and CP(t) is supplied to calculate the stability factor Ks expressed by the following expression (10) and the natural yawing frequency Fn expressed by the following Expression (11). The stability factor Ks and the natural yawing frequency Fn are ones well known as basic characteristics of vehicles to the skilled in the art. Expressions (10) and (11) use a two-wheel vehicle model.

For example, whether a vehicle's steering characteristic becomes under steer or over steer and the degree of the steering characteristic when the set applied load Fz(t) causes a change in applied load can be estimated from the stability factor Ks. The responsiveness of a vehicle can be evaluated by whether the natural yawing frequency Fn is large or small. The stability factor Ks and the natural yawing frequency Fn are output to the display 17 and the printer 18.

[Mathematical Expression 10]

$$K_s = -\frac{F'_{zf} + F'_{zr}}{(L_f + L_r)^2} \cdot \frac{L_f K_f - L_r K_r}{(K_f K_r)^2} \quad (10)$$

$\begin{cases} F'_{zf}: \text{Effective Applied Load of Front Wheel} \\ F'_{zr}: \text{Effective Applied Load of Rear Wheel} \\ L_f: \text{Distance between Front Wheel and Center of Gravity} \\ L_r: \text{Distance between Rear Wheel and Center of Gravity} \\ K_f = \frac{CP(F'_{zf})}{\tan 1°}, Kr = \frac{CP(F'_{zr})}{\tan 1°} \end{cases}$

[Mathematical Expression 11]

$$F_n = \frac{G}{2\pi V}\sqrt{\frac{K_f K_r}{F'_{zf} F'_{zr}}(1 + K_s V^2)} \quad (11)$$

$\begin{cases} G: \text{Dynamic Acceleration} \\ V: \text{Vehicle Velocity} \end{cases}$ In the present invention, a vehicle model is not limited to a two-wheel model and may be one created by commercially available software such as ADAMS (a product of SMC, Inc.), CarSim (a product of Virtual Mechanics Corporation), or veDYNA (a product of Neorium Technology CO., LTD.).

The calculated time-series data of the stability factor Ks and time-series data of the natural yawing frequency Fn are stored in the memory 14 and output to the display 17 and the printer 18.

FIGS. 15A to 15D and FIG. 16 are diagrams showing examples of various types of data obtained through the flow that is shown in FIG. 14.

Figure 15A:
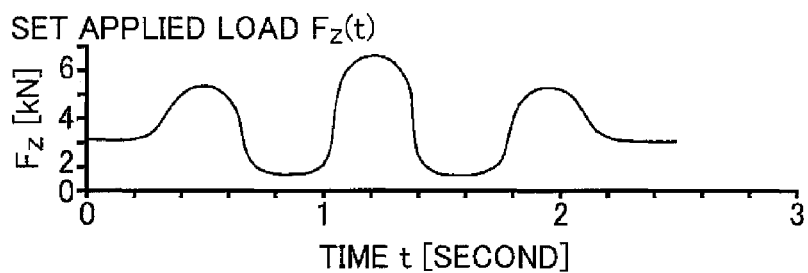
FIGS. 15A to 15D are diagrams showing examples of various types of data obtained by the flow that is shown in FIG. 14.
Figure 15B:
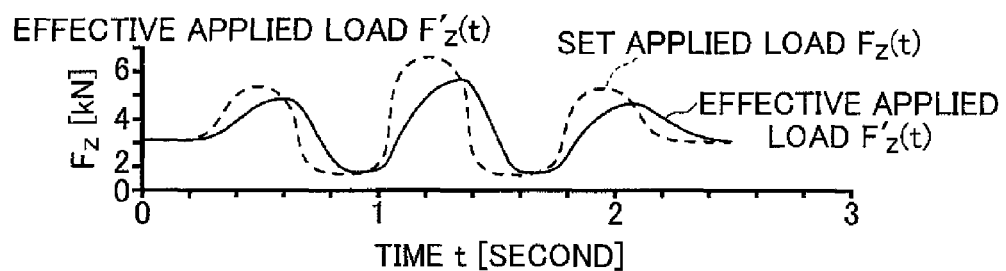

FIG. 15A shows an example of the set applied load Fz(t) which is set to a desired value in Step S300. In contrast to this set applied load Fz(t), the effective applied load Fz'(t) calculated by Expression (6) is shown in FIG. 15B. In FIG. 15B, a solid line represents the effective applied load Fz'(t) and a broken line represents the set applied load Fz(t). The effective applied load Fz'(t) has a delay with respect to the set applied load Fz(t).

Figure 15C:
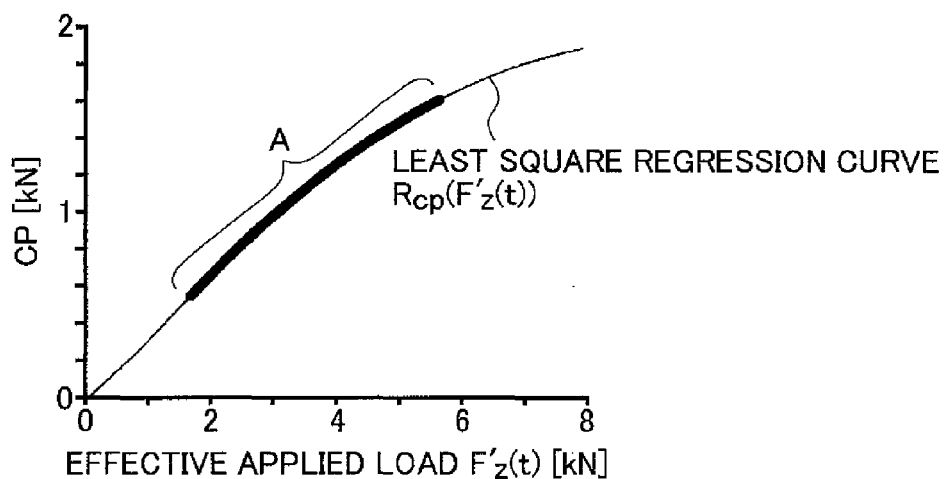

FIG. 15C shows the least square regression curve Rcp(Fz'(t)) used in calculating CP(t). A range A indicated by the bold line in the drawing is used in calculating CP(t) from the effective applied load Fz'(t) shown in FIG. 15B.

Figure 15D:
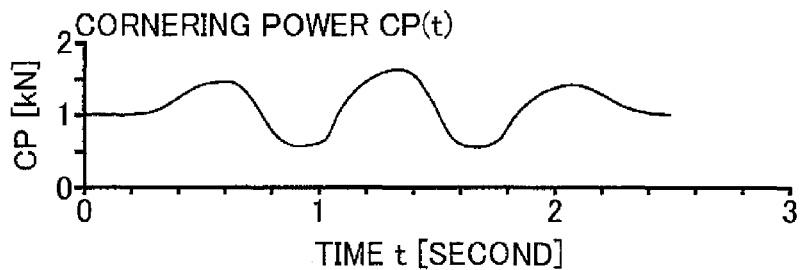

FIG. 15D shows CP(t) that is predicted with the use of the least square regression curve Rcp(Fz'(t)) shown in FIG. 15C.

In this way, CP(t) can be predicted by setting a desired value as the set applied load Fz(t) and using the response function of the first-order lag model and the least square regression curve Rep(Fz'(t)).

Figure 16:
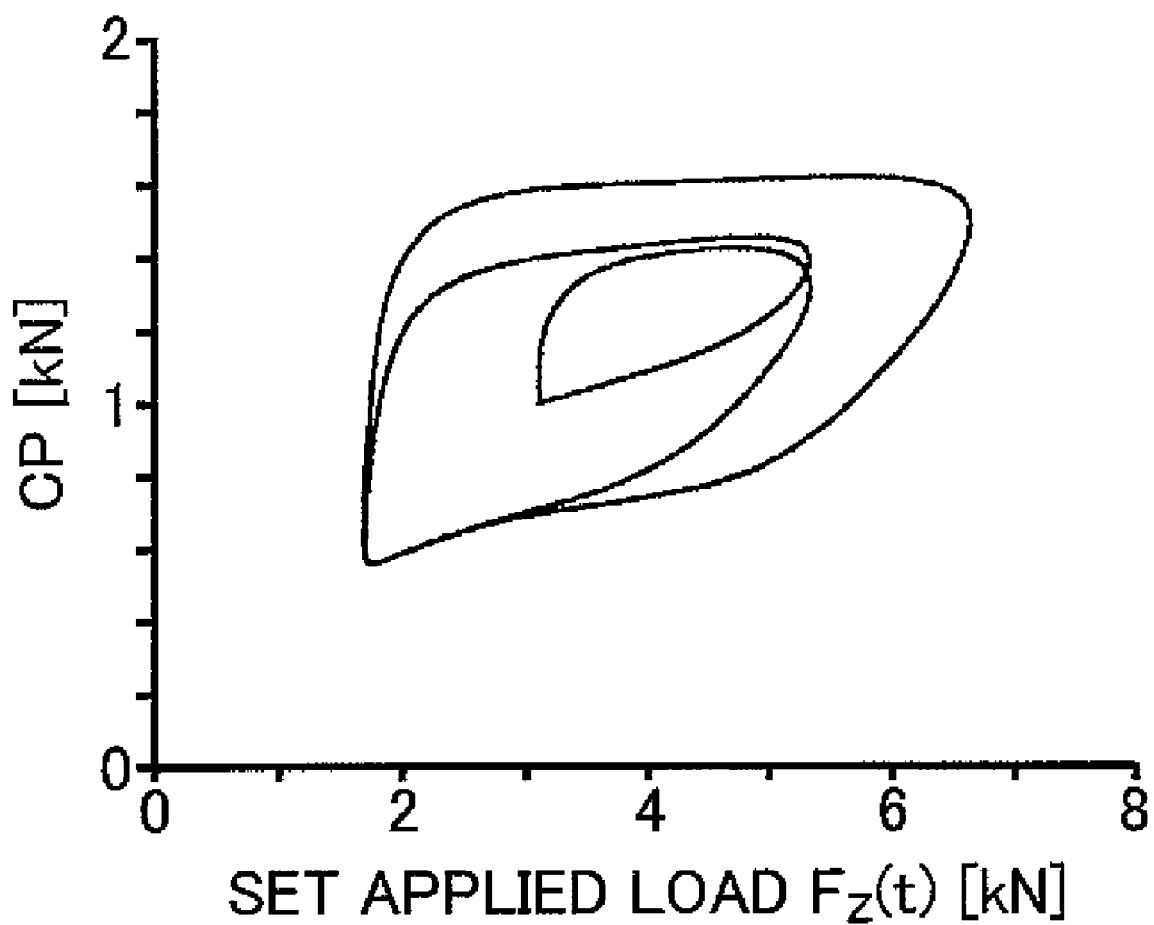
FIG. 16 is a diagram showing another example of data obtained by the flow that is shown in FIG. 14.

FIG. 16 shows a characteristic curve that represents CP(t) in relation to the set applied load Fz(t). It is understood from FIG. 16 that CP(t) responds to the set applied load Fz(t) by forming a hysteresis loop.

The thus obtained CP(t) is given to the vehicle model to calculate time-series data of the stability factor Ks and of the natural yawing frequency Fn.

FIG. 17A shows the set applied load Fz(t) given to the front wheel and rear wheel of the vehicle model. FIG. 17B shows CP(t) calculated through the flow that is shown in FIG. 14.

The calculated CP(t) has been applied to tires having different specifications A to F to study how time-series data of the stability factor Ks and of the natural yawing frequency Fn change in relation to the set applied load Fz(t) of FIG. 17A. Results are shown in FIGS. 17C and 17D. FIGS. 17C and 17D show that the stability factor Ks and natural yawing frequency Fn of one of the specifications A to F change differently from those of another of the specifications A to F. According to FIG. 17C, the stability factor Ks which indicates a steering characteristic changes at t=0.4 second, in other words, about 0.2 second after the set applied load Fz(t) leaves a constant state, varies greatly among the specifications A to F. The stability factor Ks at a time when such a change occurs can therefore be used for steering characteristic evaluation. According to FIG. 17D, the natural yawing frequency Fn which indicates a vehicle's responsiveness changes at t=0.4 second, in other words, about 0.2 second after the set applied load Fz(t) leaves a constant state, varies greatly among the specifications A to F. The natural yawing frequency Fn at a time when such a change occurs can therefore be used for responsiveness evaluation.

A comparative tire evaluation can be made by using CP(t) of tires of various specifications and one vehicle model in steering characteristic evaluation and responsiveness evaluation.

In the present invention, the values of the proportionality constants A and B in the response function of the first-order lag model which are obtained through the flow shown in FIG. 11 may serve as indicators of the dependency of a tire's cornering power (CP) on the applied load, and the cornering characteristic of the tire alone can be evaluated by using the values of the proportionality constants A and B. Generally speaking, when the value of the time constant changes greatly in accordance with the set applied load Fz(t), CP(t), also, changes significantly, thereby causing a rapid change in vehicle behavior. It is therefore desirable for the time constant not to change greatly in relation to the set applied load Fz(t), in other words, the proportionality constants A and B are desirably small. Tires of various specifications can thus be evaluated for their cornering characteristics by whether the proportionality constant is large or small.

In the present invention, when designing a tire the above-described evaluation for the tire's cornering characteristic or the above-described vehicle characteristic evaluation which uses the tire's CP(t) is performed on a test tire which serves as a basis, and the components of the test tire are adjusted according to results of the evaluation. A tire design improved from the base tire is thus obtained.

A detailed description has been given above on a tire model determining method, tire transient response data calculating method, tire evaluation method, and tire designing method of the present invention. However, the present invention is not limited to the embodiments described above, and is open to various improvements and modifications without departing from the spirit of the present invention.

What is claimed is:

1. A tire model determining method of determining a first-order lag model which simulates a transient response of a tire which is rolling from measured transient response data of the tire, the transient response data generated by giving the tire a temporally varying physical amount that sets a rolling condition of the tire, comprising the steps of:

initially setting a time constant of the first-order lag model to introduce a response function of a first-order lag response in the first-order lag model;

performing a regression calculation which includes:

obtaining, as time-series data of a transient response of the physical amount, effective data of the physical amount by calculating a convolution integral of the introduced response function of the first-order lag response and a time gradient of time-series data of the physical amount which has been given as the rolling condition to the tire;

performing a least square regression on a characteristic curve that represents values of the measured transient response data of the tire with respect to values of the effective data to obtain a single smooth curve by using a curve function for representing a curve; and calculating a sum of square residuals between a least square regression curve obtained in the least square regression and the characteristic curve; and determining the first-order lag model by correcting the set time constant and repeating the regression calculation, until the calculated sum of square residuals is minimized or until the sum of square residuals reaches a given value or lower, and by determining a time constant that minimizes the sum of square residuals or a time constant that makes the sum of square residuals equal to the given value or smaller, as an optimum time constant that defines the first-order lag response.

2. The tire model determining method according to claim 1, wherein the first-order lag model which simulates the transient response of the tire is for simulating a transient response of a longitudinal force of the tire from measurement data of the transient response of the longitudinal force of the tire, which is obtained by giving the tire an increase and decrease of a slip ratio in a longitudinal direction of the tire, wherein the physical amount is the slip ratio in the longitudinal direction of the tire, wherein the transient response of the tire is a response of a longitudinal force acting on a rotational axis of the tire, and wherein the tire model determining method further comprises, in determining the first-order lag model, determining a time constant at which the sum of square residuals becomes equal to or lower than the given value as the optimum time constant that defines the first-order lag response.

3. The tire model determining method according to claim 2, wherein the slip ratio is given so that a braking force is generated as the longitudinal force of the tire, wherein the time constant of the first-order lag model is defined by a function that changes in accordance with the slip ratio, that sets the time constant to a first value when the slip ratio is 0, that changes the time constant monotonously from the first value to a second value as the slip ratio increases, and that keeps the time constant at the second value from then on, wherein the step of introducing the response function of the first-order lag response includes introducing the response function of the first-order lag response in the first-order lag model by setting the first value and the second value which define the time constant and setting the time constant of the first-order lag model, and wherein the step of determining the first-order lag model includes:

repeating a correction of at least one of the set first value and the set second value which are parameter values and the regression calculation by using the corrected parameter value or values until the sum of square residuals reaches the given value or lower; and determining, as optimum values that define the optimum time constant that determines the first-order lag response, the parameter values of the first value and the second value at which the sum of square residuals is equal to or lower than the given value, to determine the first-order lag model.

4. The tire model determining method according to claim 1, wherein the first-order lag model which simulates the transient response of the tire is for simulating a transient response of a lateral force of the tire from measurement data of the transient response of the lateral force of the tire, which is obtained by giving the tire an increase and decrease of an applied load, wherein the physical amount is the applied load given to the tire, wherein the transient response of the tire is a response of a lateral force acting on a rotational axis of the tire, and wherein the tire model determining method further comprises, in determining the first-order lag model, determining a time constant at which the sum of square residuals is minimum as the optimum time constant that defines the first-order lag response.

5. The tire model determining method according to claim 4, wherein the step of introducing the response function of the first-order lag response, in which the time constant of the first-order lag model is in proportion the lateral force, includes introducing the response function of the first-order lag response in the first-order lag model by setting a value of a proportionality constant of the time constant to the lateral force as an initial value, whereby setting the time constant of the first-order lag model, and wherein the step of determining the first-order lag model includes:

repeating a correction of the set value of the proportionality constant and the regression calculation by using the corrected set value until the sum of square residuals reaches a minimum value; and determining a value of the proportionality constant that minimizes the sum of square residuals as the optimum value of the proportionality constant that defines the first-order lag response, to determine the first-order lag model.

6. The tire model determining method according to claim 4, further comprising obtaining, in obtaining the measurement data of the lateral force, data representing dependency of a contact length of the tire on the applied load in addition to the measurement data of the lateral force, wherein the step of introducing the response function of the first-order lag response, in which the time constant of the first-order lag model is in proportion to a square of the contact length of the tire, includes determining the response function of the first-order lag response in the first-order lag model by setting a value of a proportionality constant of the time constant to the square of the contact length as an initial value and setting the time constant of the first-order lag model, and wherein the step of determining the first-order lag model includes:

repeating a correction of the set value of the proportionality constant and the regression calculation by using the corrected set value until the sum of square residuals reaches a minimum value; and determining a value of the proportionality constant that minimizes the sum of square residuals as an optimum value of the proportionality constant that defines the first-order lag response, to determine the first-order lag model.

7. A tire transient response data calculating method of calculating transient response data of a tire which is rolling, transient response data generated by giving the tire desired time-series data of a physical amount that sets a rolling condition of the tire, comprising the steps of:

introducing, by using a tire model determining method, a response function of a first-order lag model which simulates a transient response of the tire, and obtaining a least square regression curve used in determining the first-order lag model; and performing a transient response data calculation which includes:

obtaining, as time-series data of the transient response of the physical amount, first effective data by calculating a convolution integral of the response function of the first-order lag and a time gradient of the desired time-series data; and calculating values of the least square regression curve with respect to the first effective data as values of the transient response data of the tire to changes of the physical amount, wherein the tire model determining method is a method of determining the first-order lag model which simulates a transient response of the tire which is rolling from measured transient response data of the tire, the transient response data generated by giving the tire a temporally varying value of the physical amount that sets a rolling condition of the tire, and wherein the tire model determining method comprises the steps of:

initially setting a time constant of the first-order lag model to introduce the response function of a first-order lag response in the first-order lag model;

performing a regression calculation which includes:

obtaining, as time-series data of the transient response of the physical amount, second effective data of the physical amount by calculating a convolution integral of the introduced response function of the first-order lag and a time gradient of time-series data of the physical amount which has been given as a rolling condition to the tire;

performing a least square regression on a characteristic curve that represents values of the measured transient response data of the tire with respect to values of the second effective data to obtain a single smooth curve by using a curve function for representing a curve; and calculating a sum of square residuals between a least square regression curve obtained in the least square regression and the characteristic curve; and determining the first-order lag model by repeating a correction of the set time constant and the regression calculation by using the corrected set time constant, until the calculated sum of square residuals is minimized or until the sum of square residuals reaches a given value or lower, and by determining a time constant that minimizes the sum of square residuals or a time constant that makes the sum of square residuals equal to the given value or lower, as an optimum time constant that defines the first-order lag response.

8. The tire transient response data calculating method according to claim 7, wherein the first-order lag model is for simulating the transient response of a longitudinal force of the tire, wherein the physical amount is a slip ratio in the longitudinal direction of the tire, wherein the measured transient response data of the tire and the transient response data to be calculated of the tire are data of a longitudinal force acting on a rotational axis of the tire, and wherein the tire transient response data calculating method further comprises, in determining the first-order lag response, determining a time constant that makes the sum of square residuals equal to or lower than the given value as the optimum time constant that defines the first-order lag response.

9. The tire transient response data calculating method according to claim 8, wherein, in the tire model determining method, the slip ratio is given so that a braking force is generated as the longitudinal force of the tire, wherein the time constant of the first-order model is defined by a function that changes in accordance with the slip ratio, that sets the time constant to a first value when the slip ratio is 0, that changes the time constant monotonously from the first value to a second value as the slip ratio increases, and that keeps the time constant at the second value from then on, wherein the step of introducing the response function of the first-order lag response of the tire model determining method includes introducing the response function of the first-order lag response in the first-order lag model by setting the first value and the second value which define the time constant, whereby setting the time constant of the first-order lag model, and wherein the step of determining the first-order lag model of the tire model determining method includes:

repeating a correction of at least one of the set first value and the set second value which are parameter values and the regression calculation by using the corrected set value or values until the sum of square residuals reaches the given value or lower; and determining, as optimum values that define the optimum time constant that determines the first-order lag response, the parameter values of the first value and the second value at which the sum of square residuals is equal to or lower than the given value, to determine the first-order lag model.

10. The tire transient response data calculating method according to claim 7, wherein the first-order lag model is for simulating a transient response of a lateral force of the tire, wherein the physical amount is an applied load which is given to the tire, wherein the measured transient response data of the tire and the transient response data to be calculated of the tire are data of a lateral force acting on a rotational axis of the tire, and wherein the tire transient response data calculating method further comprises, in determining the first-order lag response, determining a time constant that minimizes the sum of square residuals as the optimum time constant that defines the first-order lag response.

11. The tire transient response data calculating method according to claim 10,
wherein the step of introducing the response function of the first-order lag response of the tire model determining method, in which the time constant of the first-order lag model is in proportion to the lateral force, includes introducing the response function of the first-order lag response in the first-order lag model by setting a value of a proportionality constant of the time constant to the lateral force as an initial value, whereby setting the time constant of the first-order lag model, and
wherein the step of determining the first-order lag model of the tire model determining method includes:
repeating a correction of the set value of the proportionality constant and the regression calculation by using the corrected set value until the sum of square residuals reaches a minimum value; and
determining a value of the proportionality constant that minimizes the sum of square residuals as an optimum value of the proportionality constant that defines the first-order lag response, to determine the first-order lag model.

12. The tire transient response data calculating method according to claim 10, further comprising obtaining, in obtaining the measurement data of the lateral force, data representing dependency of a contact length on the applied load in addition to the measurement data of the lateral force,
wherein the step of introducing the response function of the first-order lag response of the tire model determining method, in which the time constant of the first-order lag model is in proportion to a square of the contact length of the tire, includes introducing the response function of the first-order lag response in the first-order lag model by setting a value of a proportionality constant of the time constant to the square of the contact length as an initial value, whereby setting the time constant of the first-order lag model, and
wherein the step of determining the first-order lag model of the tire model determining method includes:
repeating a correction of the set value of the proportionality constant and the regression calculation by using the corrected set value until the sum of square residuals reaches a minimum value; and
determining a value of the proportionality constant that minimizes the sum of square residuals as an optimum value of the proportionality constant that defines the first-order lag response, to determine the first-order lag model.

13. The tire transient response data calculating method according to claim 7,
wherein values of the transient response data are calculated sequentially for each time step which is defined by a certain time width,
wherein the step of calculating the transient response data includes calculating the second effective data in a time step by determining the time constant by using the value of the transient response data that has been calculated at a time prior to the time step.

14. A tire evaluating method comprising the steps of:
obtaining an optimum value of a proportionality constant of a time constant which is calculated by a tire model determining method for a tire; and
evaluating the tire by using the optimum value of the proportionality constant,
wherein the tire model determining method is a method of determining a first-order lag model which simulates a transient response of a lateral force of the tire from measurement data of the transient response of the lateral force of the tire, the transient response generated by giving the tire an increase and decrease of an applied load while fixing a slip angle to a given value,
wherein the tire model determining method comprises the steps of:
initially setting the time constant of the first-order lag model to introduce a response function of a first-order lag response in the first-order lag model;
performing a regression calculation which includes:
obtaining, as time-series data of a transient response of the applied load, effective applied load data by calculating a convolution integral of the introduced response function of the first-order lag and a time gradient of time-series data of the applied load which has been given as a measurement condition to the tire;
performing a least square regression on a characteristic curve that represents values of the measurement data of the lateral force with respect to values of the effective applied load data to obtain a single smooth curve by using a curve function for representing a curve; and
calculating a sum of square residuals between a least square regression curve obtained in the least square regression and the characteristic curve; and
determining the first-order lag model by repeating a correction of the set time constant and the regression calculation by using the corrected set time constant until the calculated sum of square residuals is minimized, and by determining a time constant that minimizes the sum of square residuals as an optimum time constant that defines the first-order lag response,
wherein the step of introducing the response function of the first-order lag response of the tire model determining method, in which the time constant of the first-order lag model is in proportion to the lateral force, includes introducing the response function of the first-order lag response in the first-order lag model by setting a value of the proportionality constant of the time constant to the lateral force as an initial value, whereby setting the time constant of the first-order lag model, and
wherein the step of determining the first-order lag model of the tire model determining method includes:
repeating a correction of the set value of the proportionality constant and the regression calculation by using the corrected set value until the sum of square residuals reaches a minimum value; and
determining a value of the proportionality constant that minimizes the sum of square residuals as the optimum value of the proportionality constant that defines the first-order lag response, to determine the first-order lag model.

15. The tire evaluating method according to claim 14, wherein the transient response of the lateral force is calculated under a preset applied load which changes in time and the tire is evaluated by predicting behavior of a vehicle by using a vehicle model to which the calculated transient response is given.

16. A tire evaluating method comprising the steps of:
obtaining an optimum value of a proportionality constant of a time constant which is calculated by a tire model determining method for a tire; and
evaluating the tire by using the value of the proportionality constant, wherein the tire model determining method is a method of determining a first-order lag model which simulates a transient response of a lateral force of the tire from measurement data of the transient response of the lateral force of the tire, the transient response generated by giving the tire an increase and decrease of an applied load while fixing a slip angle to a given value, wherein the tire model determining method comprises the steps of:

initially setting a time constant of the first-order lag model to introduce a response function of a first-order lag response in the first-order lag model;

performing a regression calculation which includes:

obtaining, as time-series data of a transient response of the applied load, effective applied load data by calculating a convolution integral of the introduced response function of the first-order lag and a time gradient of time-series data of the applied load which has been given as a measurement condition to the tire;

performing a least square regression on a characteristic curve that represents values of the measurement data of the lateral force with respect to values of the effective applied load data to obtain a single smooth curve by using a curve function for representing a curve;

calculating a sum of square residuals between a least square regression curve obtained in the least square regression and the characteristic curve; and determining the first-order lag model by repeating a correction of the set time constant and the regression calculation by using the corrected set time constant until the calculated sum of square residuals is minimized, and by determining a time constant that minimizes the sum of square residuals as an optimum time constant that defines the first-order lag response, wherein the tire model determining method further comprises obtaining, in obtaining the measurement data of the lateral force, data representing dependency of a contact length of the tire on the applied load in addition to the measurement data of the lateral force, wherein the step of introducing the response function of the first-order lag response of the tire model determining method, in which the time constant of the first-order lag model is in proportion to a square of the contact length of the tire, includes introducing the response function of the first-order lag response in the first-order lag model by setting a value of a proportionality constant of the time constant to the square of the contact length as an initial value, whereby setting the time constant of the first-order lag model, and wherein the step of determining the first-order lag model of the tire model determining method includes:

repeating a correction of the set value of the proportionality constant and the regression calculation by using the corrected set value until the sum of square residuals reaches a minimum value; and determining a value of the proportionality constant that minimizes the sum of square residuals as the optimum value of the proportionality constant of the time constant that defines the first-order lag response, to determine the first-order lag model.

17. The tire evaluating method according to claim 16, wherein the transient response of the lateral force is calculated under a preset applied load which changes in time and the tire is evaluated by predicting behavior of a vehicle by using a vehicle model to which the calculated transient response is given.

18. A tire designing method comprising designing a tire by adjusting components of a test tire which serves as a basis according to a result of evaluating the test tire by using a tire evaluating method, wherein the tire evaluating method comprises the steps of:

obtaining an optimum value of a proportionality constant of a time constant which is calculated by a tire model determining method for the test tire; and using the value of the proportionality constant to evaluate the test tire, wherein the tire model determining method is a method of determining a first-order lag model which simulates a transient response of a lateral force of the test tire from measurement data of the transient response of the lateral force of the tire, the transient response generated by giving the tire an increase and decrease of an applied load while fixing a slip angle to a given value, wherein the tire model determining method comprises the steps of:

initially setting a time constant of the first-order lag model to introduce a response function of a first-order lag response in the first-order lag model;

performing a regression calculation which includes:

obtaining, as time-series data of a transient response of the applied load, effective applied load data by calculating a convolution integral of the introduced response function of the first-order lag and a time gradient of time-series data of the applied load which has been given as a measurement condition to the tire;

performing a least square regression on a characteristic curve that represents values of the measurement data of the lateral force with respect to values of the effective applied load data to obtain a single smooth curve by using a curve function for representing a curve; and calculating a sum of square residuals between a least square regression curve obtained in the least square regression and the characteristic curve; and determining the first-order lag model by repeating a correction of the set time constant and the regression calculation by using the corrected set time constant until the calculated sum of square residuals is minimized, and by determining a time constant that minimizes the sum of square residuals as an optimum time constant that defines the first-order lag response, wherein the step of introducing the response function of the first-order lag response of the tire model determining method, in which the time constant of the first-order lag model is in proportion to the lateral force, includes introducing the response function of the first-order lag response in the first-order lag model by setting a value of a proportionality constant of the time constant to the lateral force as an initial value, whereby setting the time constant of the first-order lag model, and wherein the step of determining the first-order lag model of the tire model determining method includes:

repeating a correction of the set value of the proportionality constant and the regression calculation by using the corrected set value until the sum of square residuals reaches a minimum value; and determining a value of the proportionality constant that minimizes the sum of square residuals as the optimum value of the proportionality constant of the time constant that defines the first-order lag response, to determine the first-order lag model.

19. A tire designing method comprising designing a tire by adjusting components of a test tire which serves as a basis according to a result of evaluating the test tire by using a tire evaluating method, wherein the tire evaluating method comprises the steps of:

obtaining an optimum value of a proportionality constant of a time constant which is calculated by a tire model determining method for the test tire; and using the value of the proportionality constant to evaluate the test tire, wherein the tire model determining method is a method of determining a first-order lag model which simulates a transient response of a lateral force of a test tire from measurement data of the transient response of the lateral force of the tire, the transient response generated by giving the tire an increase and decrease of an applied load while fixing a slip angle to a given value, wherein the tire model determining method comprises the steps of:

initially setting a time constant of the first-order lag model to introduce a response function of a first-order lag response in the first-order lag model;

performing a regression calculation which includes:

obtaining, as time-series data of a transient response of the applied load, effective applied load data by calculating a convolution integral of the introduced response function of the first-order lag and a time gradient of time-series data of the applied load which has been given as a measurement condition to the tire;

performing a least square regression on a characteristic curve that represents values of the measurement data of the lateral force with respect to values of the effective applied load data to obtain a single smooth curve by using a curve function for representing a curve; and calculating a sum of square residuals between a least square regression curve obtained in the least square regression and the characteristic curve; and determining the first-order lag model by repeating a correction of the set time constant and the regression calculation by using the corrected set time constant until the calculated sum of square residuals is minimized, and by determining a time constant that minimizes the sum of square residuals as an optimum time constant that defines the first-order lag response, wherein the tire model determining method further comprises obtaining, in obtaining the measurement data of the lateral force, data representing dependency of a contact length on the applied load in addition to the measurement data of the lateral force, wherein the step of introducing the response function of the first-order lag response of the tire model determining method, in which the time constant of the first-order lag model is in proportion to a square of the contact length of the tire, includes introducing the response function of the first-order lag response in the first-order lag model by setting a value of the proportionality constant to the square of the contact length as an initial value, whereby setting the time constant of the first-order lag model, and wherein the step of determining the first-order lag model of the tire model determining method comprises:

repeating a correction of the set value of the proportionality constant and the regression calculation by using the corrected set value until the sum of square residuals reaches a minimum value; and determining a value of the proportionality constant that minimizes the sum of square residuals as the optimum value of the proportionality constant that defines the first-order lag response, to determine the first-order lag model.

20. A tire evaluating method comprising the steps of:

obtaining transient response data of a tire which is calculated by a tire model transient response data calculating method; and evaluating the tire by using the transient response, wherein the tire model transient response data calculating method is a method of calculating transient response data of the tire which is rolling, the transient response data being generated by giving the tire desired time-series data of a slip ratio in a longitudinal direction of the tire, which sets a tire rolling condition, wherein the tire model transient response data calculating method comprises the steps of:

introducing, by using a tire model determining method, a response function of a first-order lag model which simulates a transient response of the tire, and obtaining a least square regression curve used in determining the first-order lag model; and performing a transient response data calculation which includes:

obtaining, as time-series data of the transient response of the slip ratio, first effective data by calculating a convolution integral of the response function of the first-order lag and a time gradient of the desired time-series data; and calculating values of the least square regression curve with respect to the first effective data as values of the transient response data of the tire to changes of the slip ratio, wherein the tire model determining method is a method of determining a first-order lag model which simulates a transient response of the tire which is rolling from measured transient response data of the tire, the transient response generated by giving the tire a temporally varying value of slip ratio in the longitudinal direction of the tire, which sets a tire rolling condition, and wherein the tire model determining method comprises the steps of:

initially setting a time constant of the first-order lag model to introduce the response function of a first-order lag response in the first-order lag model;

performing a regression calculation which includes:

obtaining, as time-series data of the transient response of the slip ratio, second effective data by calculating a convolution integral of the introduced response function of the first-order lag and a time gradient of time-series data of the slip ratio which has been given as a rolling condition to the tire;

performing a least square regression on a characteristic curve that represents values of the measured transient response data of the tire with respect to values of the second effective data to obtain a single smooth curve by using a curve function for representing a curve; and calculating a sum of square residuals between a least square regression curve obtained in the least square regression and the characteristic curve; and determining the first-order lag model by repeating a correction of the set time constant and the regression calculation by using the corrected set time constant until the calculated sum of square residuals reaches a given value or lower, and by determining a time constant that makes the sum of square residuals equal to or lower than the given value as an optimum time constant that defines the first-order lag response.

21. The tire evaluating method according to claim 20, wherein the transient response of the longitudinal force is calculated under a preset slip ratio in the longitudinal direction which changes in time and the tire is evaluated by predicting behavior of a vehicle by using a vehicle model to which the calculated transient response is given.

22. A tire designing method comprising the steps of:
obtaining optimum parameter values determined by a tire model determining method for a test tire which serves as a basis;
using the parameter values to evaluate the test tire; and
designing a tire by adjusting components of the test tire according to a result of the evaluation of the test tire,
wherein the tire model determining method is a method of determining a first-order lag model which simulates a transient response of a longitudinal force of a tire from measurement data of the transient response of the longitudinal force of the tire, the transient response generated by giving the tire an increase and decrease of a slip ratio in a longitudinal direction,
wherein the tire model determining method comprises the steps of:
initially setting a time constant of the first-order lag model to introduce a response function of a first-order lag response in the first-order lag model;
performing a regression calculation which includes:
obtaining, as time-series data of a transient response of the slip ratio, effective slip ratio data by calculating a convolution integral of the introduced response function of the first-order lag and a time gradient of time-series data of the slip ratio which has been given to the tire;
performing a least square regression on a characteristic curve that represents values of the measurement data of the longitudinal force with respect to values of the effective slip ratio data to obtain a single smooth curve by using a curve function for representing a curve; and
calculating a sum of square residuals between a least square regression curve obtained in the least square regression and the characteristic curve; and
determining the first-order lag model by repeating a correction of the set time constant and the regression calculation by using the corrected set time constant until the calculated sum of square residuals reaches a given value or lower, and by determining a time constant that makes the sum of square residuals equal to or lower than the given value as an optimum time constant that defines the first-order lag response,
wherein the slip ratio is given so that a braking force is generated as the longitudinal force of the tire,
wherein the time constant of the first-order model is defined by a function that changes in accordance with the slip ratio, that sets the time constant to a first value when the slip ratio is 0, that changes the time constant monotonously from the first value to a second value as the slip ratio increases, and that keeps the time constant at the second value from then on,
wherein the step of introducing the response function of the first-order lag response includes introducing the response function of the first-order lag response in the first-order lag model by setting the first value and the second value which define the time constant, whereby setting the time constant of the first-order lag model, and
wherein the step of determining the first-order lag model comprises:
repeating a correction of at least one of the set first value and second value which are parameter values and the regression calculation by using the corrected parameter value or values until the sum of square residuals reaches the given value or lower; and determining, as the optimum parameter values that define the time constant that determines the first-order lag response, parameter values of the first value and the second value at which the sum of square residuals is equal to or lower than the given value, to determine the first-order lag model.

* * * * *